US011327835B2

(12) United States Patent
Georgakos et al.

(10) Patent No.: US 11,327,835 B2
(45) Date of Patent: May 10, 2022

(54) DEVICES AND METHODS FOR DATA STORAGE

(71) Applicant: Infineon Technologies AG, Neubiberg (DE)

(72) Inventors: Georg Georgakos, Erding (DE); Michael Goessel, Mahlow (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 15 days.

(21) Appl. No.: 16/944,697

(22) Filed: Jul. 31, 2020

(65) Prior Publication Data
US 2021/0034458 A1 Feb. 4, 2021

(30) Foreign Application Priority Data

Aug. 1, 2019 (DE) .......................... 102019120801.7

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC ...... G11C 29/52; G11C 29/42; G06F 11/1068
See application file for complete search history.

(56) References Cited

U.S. PATENT DOCUMENTS

| 2003/0046632 A1* | 3/2003 | Hatakenaka | G06F 11/1012 714/763 |
| 2003/0061560 A1* | 3/2003 | Furukawa | H03M 13/11 714/764 |
| 2003/0107942 A1* | 6/2003 | Perner | G11C 7/1048 365/230.03 |
| 2005/0289441 A1* | 12/2005 | Kawagoe | G06F 11/1008 714/763 |
| 2008/0163023 A1* | 7/2008 | Hong | H03M 13/2945 714/752 |
| 2009/0013223 A1* | 1/2009 | Lam | G06F 11/1072 714/701 |
| 2010/0269016 A1* | 10/2010 | Ware | G11C 11/5621 714/763 |
| 2012/0155169 A1* | 6/2012 | Honda | G11C 16/10 365/185.03 |
| 2016/0350181 A1* | 12/2016 | Cha | G11C 29/52 |
| 2017/0163291 A1* | 6/2017 | La Rosa | G06F 11/1068 |
| 2019/0303239 A1* | 10/2019 | Hsiao | G06F 3/0616 |

FOREIGN PATENT DOCUMENTS

| DE | 102016104012 A1 | 9/2017 |
| GB | 2482112 A | 1/2012 |

* cited by examiner

*Primary Examiner* — Guy J Lamarre
(74) *Attorney, Agent, or Firm* — Slater Matsil, LLP

(57) ABSTRACT

In an embodiment, a storage device includes a multiplicity of data value memory cells and a multiplicity of check value memory cells, where at least one of the multiplicity of data value memory cells is assigned to two of the check value memory cells, and where at least one of the multiplicity of check value memory cells is assigned to two of the data value memory cells, and a correction circuit which is configured to output a corrected data value when reading out a selected data value memory cell of the at least one of the multiplicity of data value memory cells, based on a content of the selected data value memory cell and based on contents of the two check value memory cells assigned to the selected data value memory cell.

23 Claims, 10 Drawing Sheets

DEVICES AND METHODS FOR DATA STORAGE

This application claims the benefit of German Patent Application No. 102019120801.7, filed on Aug. 1, 2019, which application is hereby incorporated herein by reference in its entirety.

TECHNICAL FIELD

This disclosure relates to devices and methods for data storage.

BACKGROUND

Errors can occur in the storage of data values in data value memory cells. When the content of data value memory cells is read out, the read out content can be verified and, if necessary, corrected in order to increase the reliability of computer systems. Errors can thereby be corrected, and the effects of errors, for example on the mode of operation of a circuit, can thus be reduced or totally avoided. Conventional approaches in this respect require a comparatively large chip area for redundant data storage or cause problems in the wiring of the components required for this purpose due to intersecting lines.

SUMMARY

According to one example embodiment, a storage device is provided. The storage device includes a multiplicity of data value memory cells; a multiplicity of check value memory cells, where at least one of the multiplicity of data value memory cells is assigned to two of the check value memory cells, and where at least one of the multiplicity of check value memory cells is assigned to two of the data value memory cells; and a correction circuit is configured to output a corrected data value when reading out a selected data value memory cell of the at least one of the multiplicity of data value memory cells, based on a content of the selected data value memory cell and based on contents of the two check value memory cells assigned to the selected data value memory cell.

According to a further example embodiment, a method is provided for reading memory cells in a storage device. Here, the storage device includes a multiplicity of data value memory cells and a multiplicity of check value memory cells, where at least one of the multiplicity of data value memory cells is assigned to two of the check value memory cells. Here, the method includes: receiving a content of a selected data value memory cell of a multiplicity of data value memory cells; receiving contents from two check value memory cells of a multiplicity of check value memory cells, wherein the two check value memory cells are assigned to the selected data value memory cell; and defining a corrected data value based on: the content of the selected data value memory cell, and the contents of the two check value memory cells assigned to the selected data value memory cell.

According to a further example embodiment, a method is provided for writing memory cells. The method includes: writing a check value as a content of a check value memory cell, where the check value memory cell is assigned to two data value memory cells and where the check value is based on data values to be stored of the assigned data value memory cells; and writing the data values to be stored to the assigned data value memory cells.

DETAILED DESCRIPTION OF ILLUSTRATIVE EMBODIMENTS

Figure 1A:
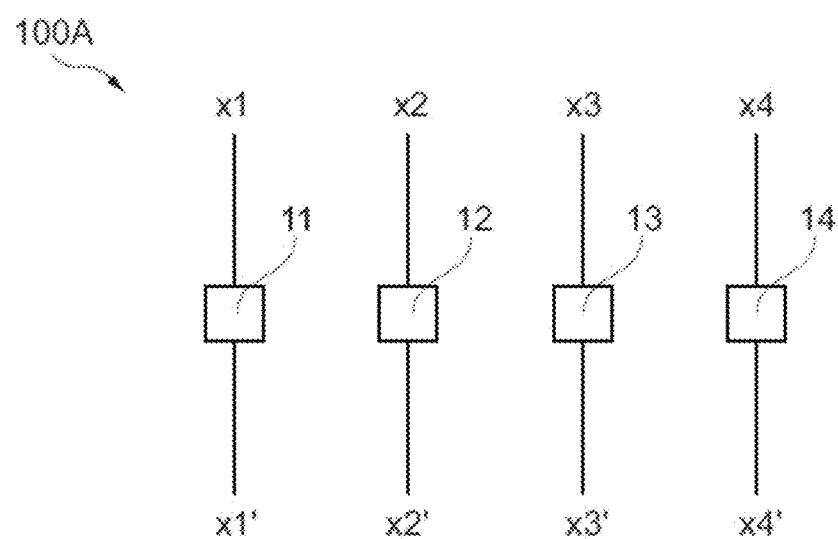
FIG. 1A and FIG. 1B show examples of storage devices.

Different example embodiments are described in detail below with reference to the attached drawings. These example embodiments are to be regarded merely as an example and are not to be interpreted as limiting. Some of the described features or components, for example, can be omitted from other example embodiments and/or can be replaced by alternative features or components. Features or components of different example embodiments can be combined to form further example embodiments. Variations and modifications which are described with regard to one example embodiment can be applied to other example embodiments also. Features or components other than those described or shown can furthermore be provided, for example features or components used in conventional devices for data storage.

Direct connections or couplings which are shown in the drawings or are described below, i.e. electrical connections or couplings without intermediate elements (for example simple metal conductor paths) can also be implemented by means of an indirect connection or coupling, i.e. a connection or coupling which comprises one or more additional intermediate elements, and vice versa, as long as the general mode of operation of the connection or coupling, for example a provision of a voltage, a provision of a current, a conduction of an electromagnetic wave or a provision of a control signal, is maintained.

The methods described above and below can also be stored as instructions on a physically present storage medium for control by means of a computer, for example as instructions for a correction circuit described below, for example in firmware. The correction circuit can be implemented on a PC comprising a memory and a processor, but also as a hard-wired logic circuit, an ASIC or other example embodiment.

The same reference numbers denote the same or similar elements in the figures. The figures are schematic representations of different example embodiments. Element shown in the figures are not necessarily presented true-to-scale. Instead, the different elements shown in the figures are presented in such a way that their function and general purpose is understandable to the person skilled in the art.

Numerical values specified in connection with example embodiments are provided for explanatory purposes only. Numerical values are not to be interpreted as limiting and are dependent on the choice of parameters and a respective implementation.

A storage device is generally to be understood to mean a device in which data can be stored. A storage device of this type can comprise e.g. a random access memory (RAM), a read-only memory (ROM), a flash memory, an EPROM, an EEPROM, fuses such as electrical fuses or laser fuses and/or other memory types. Fuses of this type can be conducting or non-conducting and can therefore similarly store data.

Storage devices can comprise memory cells, for example data value memory cells and/or check value memory cells. Check value memory cells can be designed here as structurally identical to data value memory cells or may differ from them. In cases where the check value memory cells are structurally identical to the data value memory cells, the difference does not result from the respective structural design of the memory cells themselves, but from the connection and use within the storage device. Unless otherwise indicated, general explanations of memory cells refer to both data value memory cells and check value memory cells.

Memory cells can be implemented, for example as flip-flops, latches or as memory cells of an addressable memory. Memory cells can be configured to store single bits or a plurality of bits. Bits can form a bit sequence consisting of a number of bits.

Memory cells can be configured to store one or more data values, in particular 1-bit values. Data values can be one or more bits here. The bits can be represented as digital signals.

Memory cells can be elements of a scan path.

Data values can be stored in memory cells, for example, for a certain number of clock pulses or for a specific time. Data values can be read out from memory cells. If no error occurs, the value of a data value does not change during storage and/or read-out. In other words, if no error occurs, the same data value can be read out from a memory cell as the data value that was written to the memory cell.

If the data value which is read out from a data value memory cell differs from the value which was written to the data value memory cell, an error has occurred.

In the description below, i-bit values are used as examples of data values.

In cases where a memory cell stores a single bit as content, an error, viewed at the level of the individual memory cell, means that during the read-out of the memory cell, the negated data value of the data value which was previously stored as content in the data value memory cell is obtained.

A correction circuit is understood to mean a circuit which is configured to correct errors. In cases where no error occurs, the correction circuit can be configured to provide the read out data value or a multiplicity of read out data values.

Errors can occur due to different causes, for example due to external influences such as radiation and/or heat, but also due to other factors, for example errors can occur through ageing.

A distinction can be made between permanent errors and temporary errors. Temporary errors are sometimes also referred to as time-limited, volatile or transient errors.

A permanent error can consist, for example, in that a memory cell always outputs the data value 0 always the data value 1 during read-out. The cause of this may, for example, be that the memory cell itself has been damaged, for example through ageing.

A temporary error can occur, for example, as a result of the content of a memory cell being changed from 0 to 1, for example by ionizing radiation. The memory cell itself can remain undamaged here, so that, during a new write cycle, the memory cell stores a (new) content correctly.

Errors caused, for example, by ionizing radiation, can occur in individual memory cells or in physically adjacent memory cells, e.g. in memory cells which are arranged spatially adjacent in the layout/in the chip. Errors in individual memory cells result in i-bit errors in which only one bit in a bit sequence read from a plurality of memory cells is errored.

Errors in two physically adjacent memory cells result in adjacent 2-bit errors in which two adjacent bits in the bit sequence read out from the plurality of memory cells are errored. Adjacent 2-bit errors can occur, for example, as a result of ionizing radiation. It may be desirable to design memory cells as compact and/or to arrange them in close spatial proximity, for example, in order to reduce the costs of storage devices and/or increase the data density per device volume. However, the risk of adjacent 2-bit errors can increase as a result.

The problems caused by errors in connection with storage devices are explained in detail below in connection with FIG. 1A. FIG. 1A shows here a conventional storage device 100A. However, the fundamental statements concerning the data value memory cells shown in FIG. 1A in themselves apply to example embodiments described below also.

The storage device 100A has four data value memory cells 11, 12, 13, 14. The data value memory cells 11 to 14 are configured to store data values x1 to x4 as contents. The storage can take place here during a write procedure. The storage of the contents of the data value memory cells can take place for a required time, e.g. for the duration of one or more clock pulses. In other cases, the storage can also take place constantly, for example if the storage device 100A is intermittently disconnected from a power supply. In such examples, the data value memory cells can be implemented as non-volatile memory cells or can be coupled to a power supply, for example a battery.

At a later time, for example during a read procedure, the content of one or more data value memory cells can be read out. The read out data values x1' to x4' are obtained as a result.

If no error occurs, x1'=x1, x2'=x2, x3'=x3 and x4'=x4 apply. However, if an error has occurred, for example in the data value memory cell 11, and errored value x1' unequal to x1 is read from the data value memory cell 11. If the data value memory cell is a data value memory cell which is configured to store one bit, an error causes the following to apply:

$$x1'=x1 \oplus 1.$$

Here, $\oplus$ designates the modulo 2 addition or the Exclusive-OR (XOR) operation which is synonymous.

A correction of one or more errors is not provided in the storage device 100A shown in FIG. 1.

Figure 1B:
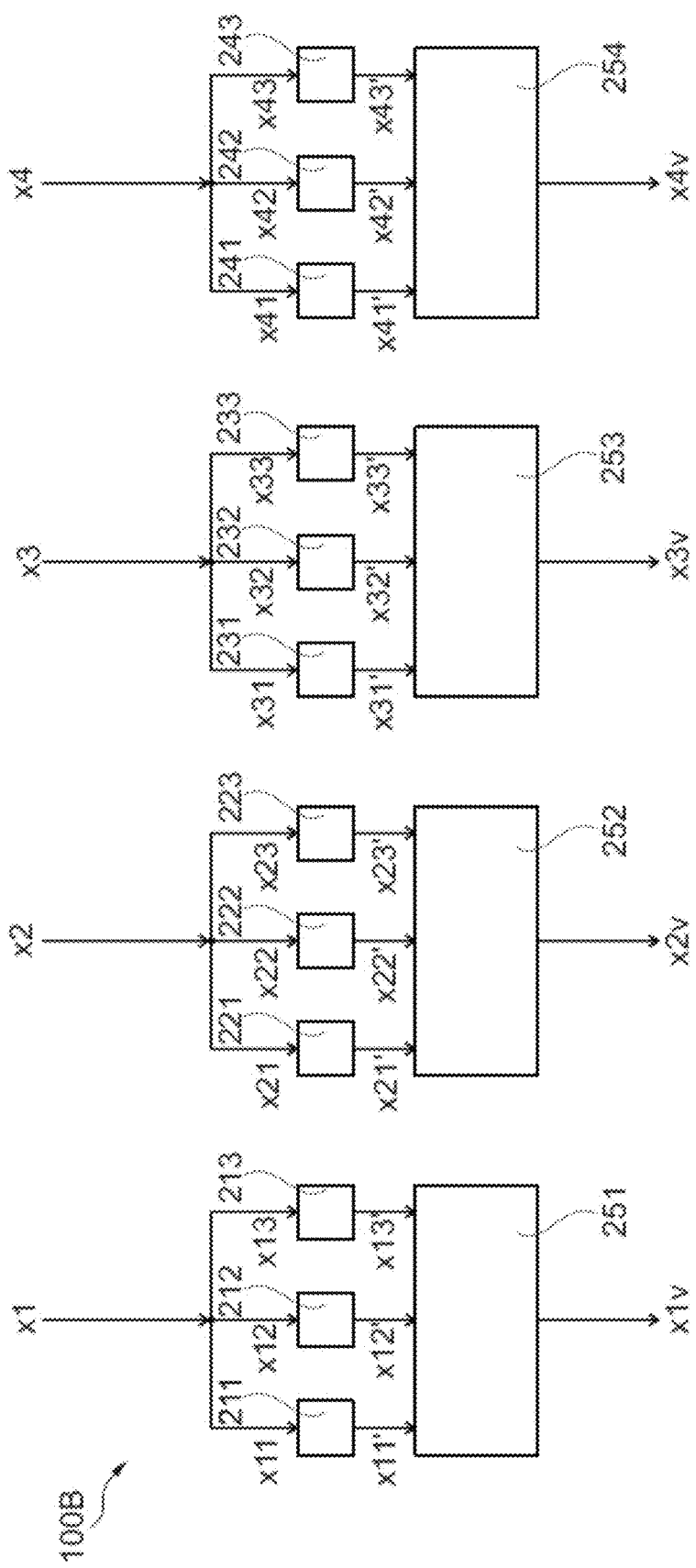

FIG. 1B shows a conventional storage device 100B. In contrast to the storage device 100A shown in FIG. 1, the storage device 100B shown in FIG. 1B has a correction circuit. The correction circuit is designed on the basis that respective data value memory cells are tripled, and associated majority deciders 251 to 254 are present for the respective redundant data value memory cells. In FIG. 1B, compared with FIG. 1, the data value memory cell 11 is replaced by the data value memory cells 211, 212, 213, the data value memory cell 12 is replaced by the data value memory cells 221, 222, 223, the data value memory cell 13 is replaced by the data value memory cells 231, 232, 233, and the data value memory cell 14 is replaced by the data value memory cells 241, 242, 243. The bit x1 in FIG. 1 is "tripled" into three bits x11, x12, x13, and is stored as respective content in the data value memory cells 211 to 213. The read out data values x11', x12', x13' which are present at three inputs of the majority decider 251 are read out from these data value memory cells. The majority decider 251 forms a majority value x1V from the bits x11' to x13' and provides this at the output of the majority decider 251. Even if only two of the values, for example, x11' and x13', match one another, the majority decider 251 forms the majority value $x1V=x11'=x13'$ and outputs it at its output.

A corresponding procedure is followed for the data values x2 to x4 also which are stored in each case in triplicate in memory cells 221-223, 231-233 and 241-243 and whose specific values x21' to x23', x31' to x33' and x41' to x43' are present at the respective three inputs of the majority deciders 252, 253 and 254, so that corrected data values x2V to x4V can be obtained.

A single error in a data value memory cell, for example an error in the data value memory cell 211, is corrected here by the majority deciders. However, if, for example, an error occurs in two adjacent data value memory cells, for example an adjacent 2-bit error as described above, the respective majority decider outputs an errored value, so that errors of this type cannot be corrected. The redundancy of FIG. 1B also results in a large number of data value memory cells, wherein the number of required data value memory cells, compared with a storage without error correction, requires a three times greater outlay without adjacent 2-bit errors being able to be corrected.

Figure 2:
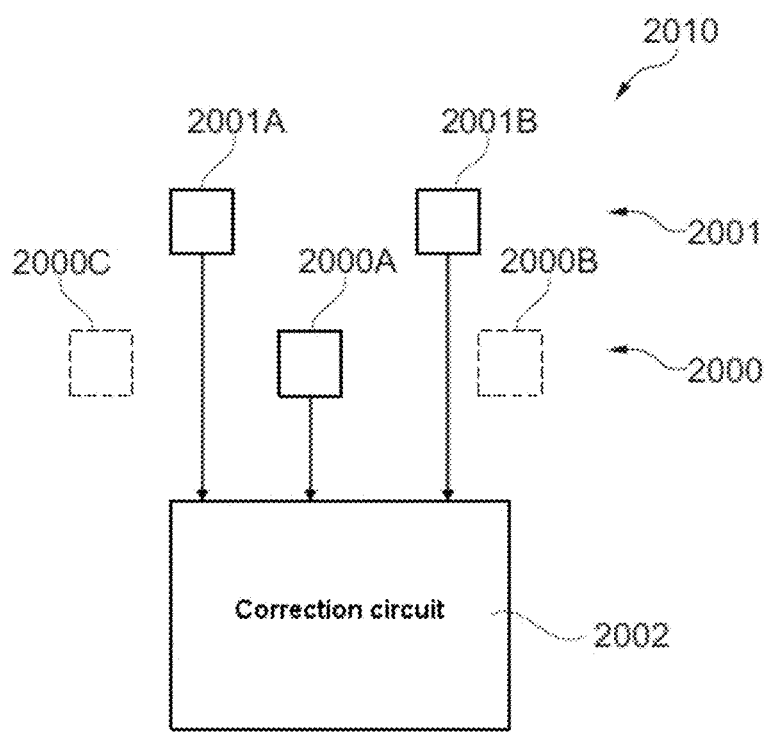
FIGS. 2 to 8 show storage devices according to different example embodiments.

FIG. 2 shows an example embodiment of a storage device 2010. This comprises:

a multiplicity of data value memory cells 2000, of which three data value memory cells 2000A, 2000B and 2000C are shown as an example, and a multiplicity of check value memory cells 2001, of which two check value memory cells 2001A, 2001B are shown as an example.

Two of the check value memory cells 2001 are assigned to at least one of the multiplicity of data value memory cells 2000 and two of the data value memory cells 2000 are assigned to at least one of the multiplicity of check value memory cells 2001. In FIG. 2, for example, the check value memory cells 2001A and 2001B are assigned to the data value memory cell 2000A, the data value memory cells 2000C and 2000A are assigned to the check value memory cell 2001A, and the data value memory cells 2000A and 2000B are assigned to the check value memory cell 2001B. "At least one of" the multiplicity of is synonymous with a proper or improper subset, i.e. all or a part of the respective multiplicity of memory cells can meet the respective criterion. The data value memory cells can also be referred to as first memory cells and the check value memory cells as second memory cells.

The storage device 2010 further comprises a correction circuit 2002 which is configured to output a corrected data value during the read-out of a selected data value memory cell (in the example shown, the data value memory cell 2000A is selected) of the at least one of the multiplicity of data value memory cells 2000 based on a content of the selected data value memory cell (here 2000A) and based on contents of the two check value memory cells (here 2001A, 2001B) assigned to the selected data value memory cell.

As a result, the required number of memory cells, with the same or improved suitability for error correction, can be reduced, for example, compared with the example shown in FIG. 1B. The complexity of the structure can further be minimized and/or the required computing outlay can be minimized and/or reduced compared with the majority decider shown in FIG. 2.

The at least one of the multiplicity of check value memory cells (e.g., 2001A, 2001B) can be configured to store a check value based on data values to be stored in the two data value memory cells assigned to it. The data value to be stored is the data value which is intended to be stored in the data value memory cell. In the error-free case, the content of the data value memory cell then matches the data to be stored. According to an example embodiment, at least one of the multiplicity of check value memory cells is configured to store a check value by combining the data values to be stored in the exactly two data value memory cells assigned to it.

Figure 3:
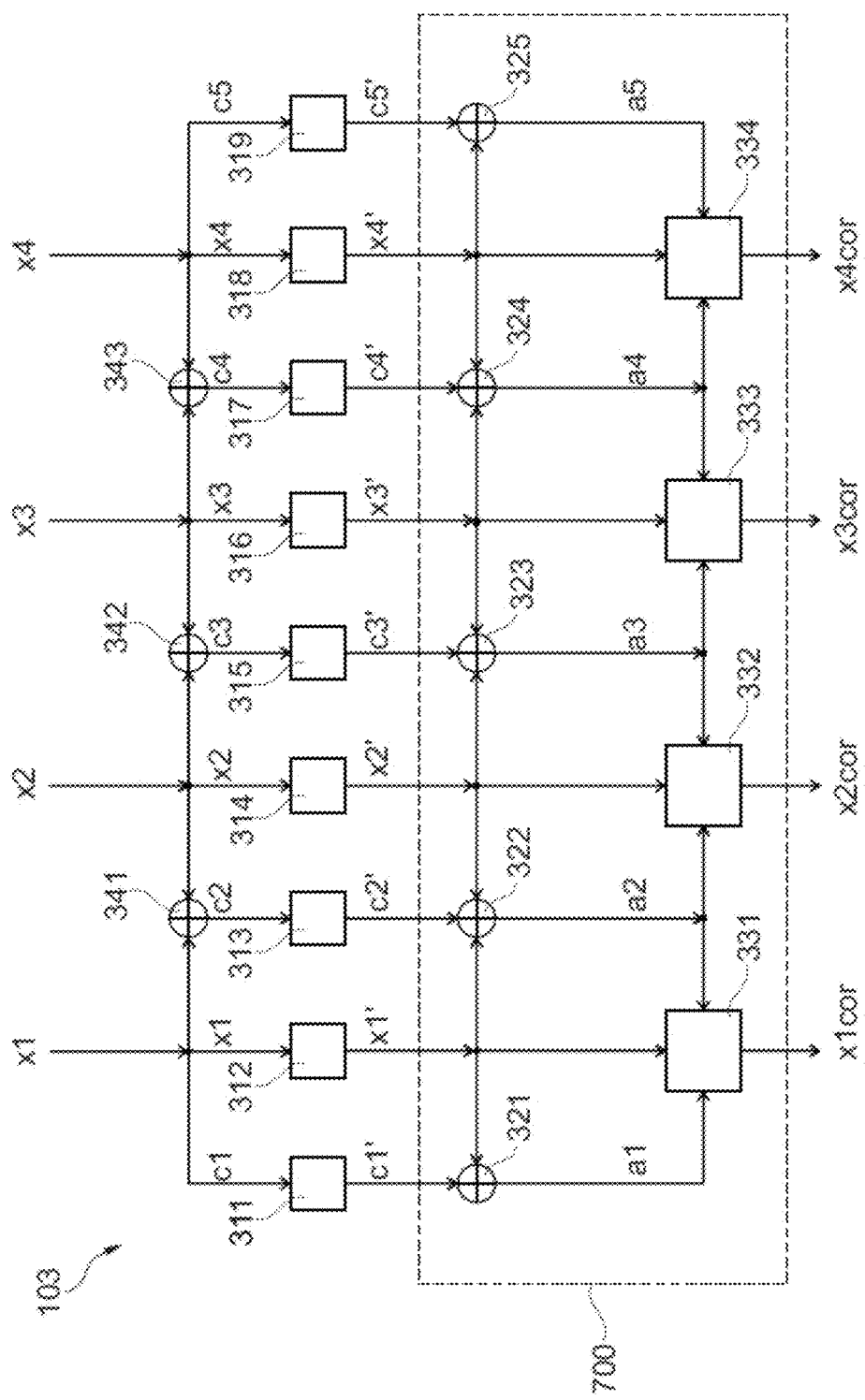

FIG. 3 shows an example embodiment of a storage device 103 according to one example embodiment. FIG. 4 to FIG. 8 show further example embodiments of storage devices, i.e. storage devices 104 to 108.

The storage devices 103, 104, 105 and 108 are configured in each case to receive and store data values x1-x4 and to provide corrected data values x1*cor*-x4*cor*. It should be noted here that the number of data values to be stored and the number of corresponding memory cells are merely examples, and more or fewer data values to be stored can also be used. In such cases, the devices shown here can be continued, for example as a repeating or as a modified repeating pattern, in order to be able to store more data values to be stored. However, a reduction to fewer memory cells is also possible. The examples shown here can also be arranged differently. It is similarly possible to combine the example embodiments shown here, for example so that x2*cor* is defined as in the example embodiment shown in FIG. 3 and x4*cor* as in the example embodiment shown in FIG. 4.

The example embodiment of the storage device 103 shown in FIG. 3 comprises a multiplicity of data value memory cells 312, 314, 316, 318 and a multiplicity of check value memory cells 311, 313, 315, 317, 319.

The storage device 103 shown in FIG. 3 further comprises a correction circuit 700. The correction circuit 700 is configured to output a corrected data value when reading out a selected data value memory cell of the at least one of the multiplicity of data value memory cells, based on a content of the selected data value memory cell and based on contents of the two check value memory cells assigned to the selected data value memory cell. According to an example embodiment, the correction circuit 700 is configured to output the corrected data value by combining the content of the selected data value memory cell solely with the contents of the two check value memory cells assigned to the selected data value memory cell.

The operation of the device shown in FIG. 3 is explained below together with example embodiments of methods for reading and/or writing memory cells in connection with the storage device 103. This serves merely to offer simpler comprehensibility and is not to be interpreted as limiting. The methods described here can, for example, also be carried out on other devices, for example the storage devices disclosed here, combinations of the storage devices disclosed here or other storage devices, or can be carried out partially independently from specific hardware implementations, for example in the form of computer programs.

Figure 9:
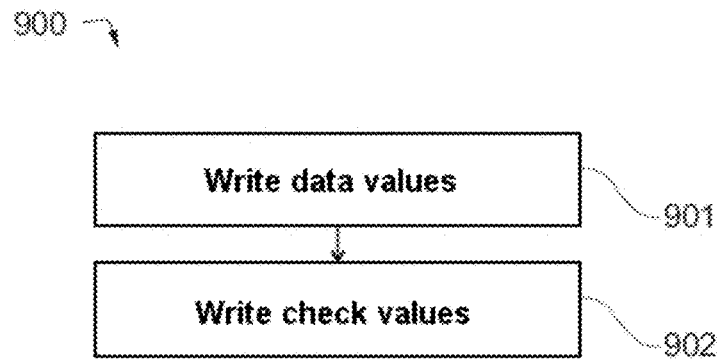
FIGS. 9 to 11 show flow diagrams for methods according to different example embodiments.

FIG. 9 shows a method for writing to memory cells according to different example embodiments. In the example shown in FIG. 3, data values x1 to x4 which are to be stored are to be stored in the storage device.

At 901 in FIG. 9, a writing of data values x1-x4 to be stored to the assigned data value memory cells 312, 314, 316 and 318 is performed. This is performed in the storage device 103 shown in FIG. 3 by writing the data value x1 to be stored to the data value memory cell 312, and correspondingly the data values x2 to x4 to be stored to the assigned data value memory cells 314, 316 and 318. In some example embodiments, the writing of the data values at 901 can also be performed for only a subset of the data values to be stored, for example only the data value x2 to be stored can be stored in the data value memory cell 314. In other words, only a part of the data value memory cells can also be used depending on data values to be stored.

If a reading and/or writing are performed for only a subset of data value memory cells, the one or more memory cells of this subset can be referred to as selected memory cell(s).

At 902, a writing of check values to memory cells is performed. Two data value memory cells, i.e. the data value memory cells 312, 314 are assigned in each case to the check value memory cells, i.e. the data value memory cells 312, 314 to the check value memory cell 313, the data value memory cells 314, 316 to the check value memory cell 315, and the data value memory cells 316, 318 to the check value memory cell 317. For these check value memory cells, the check value to be stored is based on the data values to be stored in the assigned data value memory cells. A check value c2, for example, which is to be stored in the check value memory cell 313 in FIG. 3 is defined on the basis of the data values x1 and x2 to be stored, for example by means of an XOR or XNOR operation performed on the data values x1 and x2. The check value c3 can be determined accordingly on the basis of the data values x2 and x3 to be stored. The check value c2 can be written, for example, to the check value memory cell 313, and the check value c3 can be written, for example, to the check value memory cell 315.

The check values for these check value memory cells to which two data value memory cells are assigned can be formed on the basis of an XOR operation or XNOR operation performed on the data values which are to be stored in the two data value memory cells assigned to the respective check value memory cell.

An XOR operation and an XNOR operation behave inversely in relation to one another, i.e. if the result of the XOR operation is 1, the result of the XNOR operation is 0, and vice versa. The information content in both cases is therefore the same.

The XOR operation or XNOR operation can be performed, for example, by means of a logic element. In the example embodiments shown in FIG. 3 and FIG. 8, an operation is performed by the logic elements 341, 342, 343. The logic element 540 is additionally used in the example embodiments described later and shown in FIG. 5, and the logic elements 441-443 in the example embodiment shown in FIG. 4. The logic elements are sometimes also referred to according to their operation, for example as XOR elements or XNOR elements. Logic elements can be implemented as circuits, for example as physical semiconductor circuits, but can also be performed as logical procedures, for example in a computer.

Only one data value memory cell is assigned in each case to the check value memory cells 311 and 319 which are located at the "edge" of the storage device 103, i.e. the data value memory cell 312 is assigned to the check value memory cell 311 and the data value memory cell 318 is assigned to the check value memory cell 319. In these check value memory cells, the data value to be stored in the assigned data value memory cell is stored in each case as a check value, e.g. the data value x1 to be stored is stored as the check value c1 in the check value memory cell 311.

Figure 10:
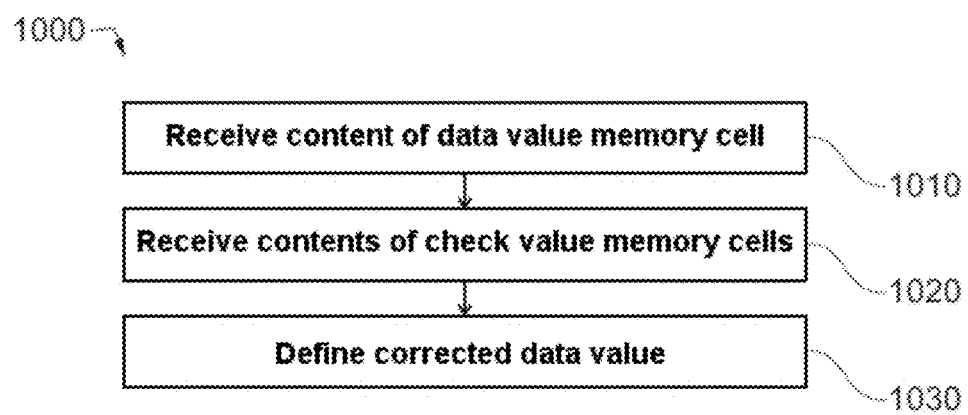

A method for reading out a storage device which has been written in this way with contents will now be described with reference to FIG. 10. Reference is made again to the storage device 103 shown in FIG. 3 for explanatory purposes. FIG. 10 shows a method 1000 for reading out a storage device as described and explained above, in particular the mode of operation of the correction circuit 700 shown in FIG. 3.

It should initially be noted that the read out contents of the data value memory cells and check value memory cells, compared with the data values and check values to be stored, are indicated by an apostrophe. If no error occurs, the values match one another.

At 1010, the method comprises receiving a content of a selected data value memory cell of a multiplicity of data value memory cells. The selected data value memory cell is the data value memory cell whose content is intended to be read out. For example, the content x2' of the data value memory cell 314 as the selected memory cell in FIG. 3 can be received.

At 1030, the method 1000 comprises defining a corrected data value based on:
the content of the selected data value memory cell received at 1010, and
the contents, received at 1020, of the two check value memory cells assigned to the selected data value memory cell.

In the above example shown in FIG. 3, the corrected data value x2cor is defined on the basis of the content x2' of the selected data value memory cell 314 and the contents c2', c3' of the two check value memory cells 313, 315 assigned to the selected data value memory cell 314. For the purposes of the investigation, these check value memory cells 313 and 315 are referred to below as the first check value memory cell 313 and the second check value memory cell 315.

In the storage device 103 shown in FIG. 3, the data value memory cell 312 is further assigned to the first check value memory cell 313. The data value memory cell 316 is further assigned to the second check value memory cell 315.

The method shown in FIG. 10 can further define the corrected data value based on the content of the further data value memory cells assigned to the two check value memory cells.

In particular, in the example embodiment shown in FIG. 3, the storage device 103 is configured to form a first correction value a2 by means of the correction circuit 700 based on the contents of the data value memory cells 312 and 314 and the check value memory cell 313. The storage device 103 is further configured to form a second correction value a3 based on an XOR operation performed on the content of the data value memory cell 314, the content of the check value memory cell 315 and the content of the data value memory cell 316. The corrected data value is then defined on the basis of x2', a2 and a3. The same applies accordingly to the example embodiments shown in FIGS. 5 and 8.

The definition of the corrected data value x2cor shown in FIG. 3 is thus based on the contents of the data value memory cells 312, 314 and 316 and the contents of the check value memory cells 313 and 315.

Figure 11:
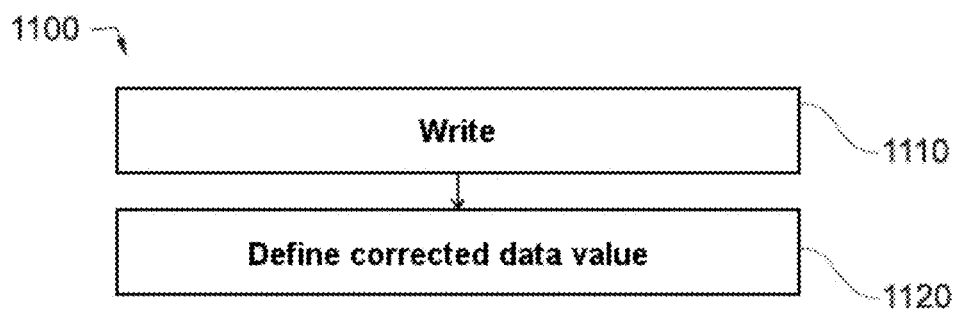

The methods shown in FIGS. 9 and 10 can be combined as a whole into a method for defining a storage device as shown in FIG. 11.

The method 1100 shown In FIG. 11 for operating a storage device comprises:
at 1110, writing at least one data value to at least one selected data value memory cell according to the described method for writing memory cells, for example according to the method 900 shown in FIG. 9, and
at 1120, defining at least one corrected data value by means of the method for reading memory cells, for example by means of the method 1000 shown in FIG. 10.

The methods described here can be implemented, for example, in the form of a write and/or read control device, for example a write and/or read circuit. The methods for reading, but also additionally or alternatively the methods for writing can also be part of the correction circuit. Distributed implementations among different functional units are also possible.

As mentioned above, these methods are not limited to the example embodiment shown in FIG. 3. In particular, the methods described above can be used according to the methods and example embodiments described below. Further details of the storage device 103 will now be described and generalized below. The principles described can similarly be transferred to example embodiments described or combined here.

The mode of operation of the storage device 103 shown in FIG. 3 will now be explained in further detail.

In the example embodiment of the storage device 103, the data values x1 to x4 are 1-bit values. Generally speaking, data values, for example bits, $x_1 \ldots x_n$ can be considered. Two consecutive bits $x_1$, $x+1$ in each case form a check value in FIG. 3. In the cases where the data values are bits, these check values are also referred to below as check bits.

A check bit $c_{i+1}$ is defined in FIG. 3 according to $c_{i+1} = x_i \oplus x_{i+1}$ for $i=1, \ldots, n-1$. A check bit $c_1 = x_1$ and a check bit $c_{n+1} = x_n$ are further formed. The consecutive bits $x_1$, $x_2$ thus form the check bit $c_2 = x_1 \oplus x_2$.

The consecutive bits $x_2$, $x_3$ form the check bit $c_3 = x_2 \oplus x_3$. The consecutive bits $x_3$, $x_4$ form the check bit $c_4 = x_3 \oplus x_4$. $c_1 = x_1$ and $c_5 = x_4$ further apply to the example embodiment shown in FIG. 3.

The two check bits c1 and c5 for n3 can be formed in some example embodiments by a single check bit $c_{1,n} = c_1, 4 = x_1 \oplus x_n = x_1 \oplus x_4$. This is shown in the example embodiment in FIG. 5 and is described below.

Since the check bits are formed in each case from only two, furthermore adjacent, data bits, the formation of the check bits requires only one gate delay. The geometric complexity of the storage device can be minimized and/or the speed of the storage and/or read procedures can be improved as a result.

A small hardware outlay and/or a short time delay can therefore be achieved through such definitions of check values as described here, above and below.

The check bits are therefore defined as a parity of consecutive bits. In the example shown in Figure, c2, c3, c4 are in each case the parity of the consecutive bits x1, x2 and x2, x3 and x3, x4. Check bits of this type can also be referred to as parity bits. In the example shown in FIG. 3, the check bits c2, c3, c4 are formed using the XOR elements 341, 342, 343. The XOR elements can be implemented, for example, as circuits, for example as gates. As mentioned, the logic can also be inverted by using XNOR elements.

As mentioned, $n+1=5$ XOR elements 321 to 325 are present for reading out the storage device 103. The XOR elements 321 and 325 have two inputs and one output. The XOR elements 322, 323 and 324 have three inputs and one output. The correction values a1 to a5 are formed herewith.

The output of the check value memory cell 311 is connected to a first input of the XOR element 321 to whose second input the output of the memory cell 312 is connected. The output of the data value memory cell 312 is additionally in contact with the first input of the combinatorial element 331 which outputs the corrected data value x1cor at its output. The output of the data value memory cell 312 is further connected to the second input of the XOR element 322.

The output of the check value memory cell 313 is connected to the first input of the XOR element 322.

The output of the data value memory cell 314 is connected to the third input of the XOR element 322. The output of the data value memory cell 314 is additionally in contact with the first input of the combinatorial element 332 which outputs the corrected data value x2cor at its output if the value x2' corrected. The output of the memory cell 314 is further connected to the second input of the XOR element 323.

The output of the check value memory cell 315 is connected to the first input of the XOR element 323.

The output of the data value memory cell 316 is connected to the third input of the XOR element 323. The output of the data value memory cell 316 is additionally in contact with the first input of the combinatorial element 333 which outputs the corrected data value x3cor at its output if the value x3' is corrected. The output of the data value memory cell 316 is further connected to the second input of the XOR element 324.

The output of the check value memory cell 317 is connected to the first input of the XOR element 324.

The output of the data value memory cell 318 is connected to the third input of the XOR element 324. The output of the data value memory cell 318 is additionally in contact with a first input of the combinatorial element 334 which outputs the corrected data value x4cor at its output if the value x4' is corrected. The output of the data value memory cell 318 is further connected to the second input of the XOR element 325.

Specifically, the output of the memory cell 319 is connected to the first input of the XOR element 325 for this purpose.

The output of the XOR element 321 at which the correction value a1 is output is fed to a second input of the combinatorial element 331.

The output of the XOR element 322 at which the correction value a2 is output is fed to a third input of the combinatorial element 331 and to a second input of the combinatorial element 332.

The output of the XOR element 323 at which the correction value a3 is output is fed to a third input of the combinatorial element 332 and to a second input of the combinatorial element 333.

The output of the XOR element 324 at which the correction value a4 is output is fed to a third input of the combinatorial element 333 and to a second input of the combinatorial element 334.

The output of the XOR element 325 which carries the binary value a5 is fed to the third input of the combinatorial element 334.

The combinatorial elements 331 to 334 of the storage device can further be configured:
  to form a logical value based on a first logical operation performed on the two respectively fed correction values a1, and
  to form the corrected data value x1cor based on a second logical operation performed on the content xi1 of the selected data value memory cell and on the logical value.

Figure 8:
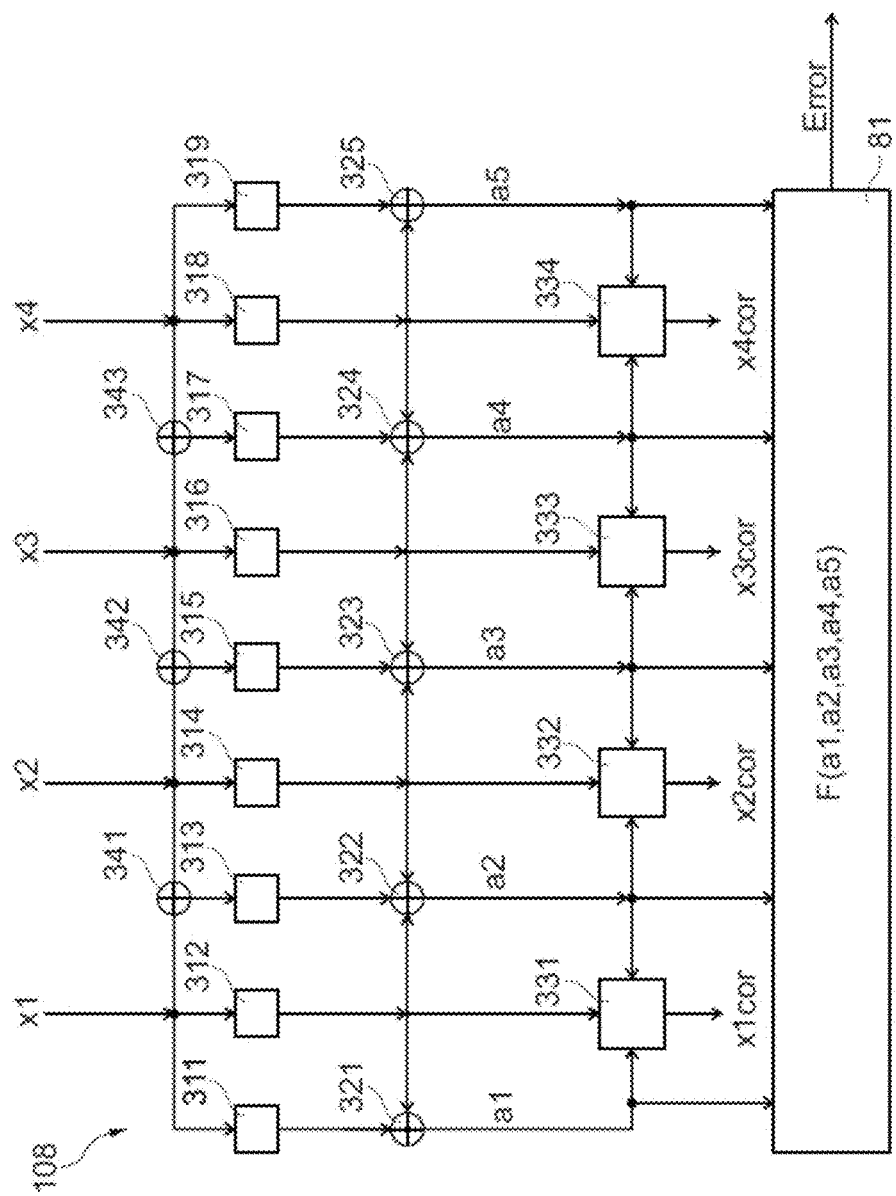

The combinatorial elements 331 to 334 of the storage device 103 shown in FIG. 3 and the storage device 108 shown in FIG. 8 can thus provide corrected data values x1cor in this way. The same applies accordingly to the combinatorial elements 431 to 434 of the storage device 104 shown in FIG. 4 and the combinatorial elements 531, 332, 333, 535 shown in FIG. 5.

Here, the first logical operation can comprise an AND operation or a NAND operation, and the second logical operation can comprise an XOR operation or an XNOR operation.

The combinatorial elements 331, 332, 333 and 334 output the corrected data values, in this case corrected data bits, x1cor, x2cor, x3cor and x4cor at their outputs. These combinatorial elements are designed so that they form the values:

$$x1cor = x1' \oplus (a1 \wedge a2),$$

$$x2cor = x2' \oplus (a2 \wedge a3),$$

$$x3cor = x3' \oplus (a3 \wedge a4), \text{ and}$$

$$x4cor = x4' \oplus (a4 \wedge a5)$$

and find them at their outputs. Here, ∧ is the AND operation.

How errors are hereby corrected is explained below.

In the example shown in FIG. 3, the memory cells 311 to 319 output the possibly errored values c1', x1', c2', x2', c3', x3', c4', x4', c5' at their outputs during the read-out, based on their respective contents. The values are equal to the check values and data values c1, x1, c2, x2, c3, x3, c4, x4, c5 written to the memory cell if no error has occurred. If an error has occurred, they differ from one another. Errors of this type can be corrected. This is explained with reference to the combinatorial element 332.

As described, the combinatorial element 332 is designed so that is forms the value $$x2cor = f(x2', a2, a3) = x2' \oplus (a2 \wedge a3)$$

and outputs it at its output. The read out contents of the memory cells 312-316, i.e. x1', c2', x2', c3' and x3', are incorporated herein.

If only the output of the data value memory cell 314 is errored, the following applies:

$$x2' = x2 \oplus 1.$$

The following then also applies simultaneously:

$$a2 = a3 = 1$$

and therefore:

$$x2cor = x2' \oplus (a2 \wedge a3) = x2 \oplus 1 \oplus (1 \wedge 1) = x2 \oplus 1 \oplus 1 = x2,$$

and the errored value $x2' = x2 \oplus 1$ is corrected to the correct value x2.

If only the output $c3' = c3 \oplus 1$ of the check value memory cell 315 is errored, the following applies:

x2'=x2, a2=0 and a3=1 and therefore:

$x2cor = x2' \oplus (a2 \wedge a3) = x2 \oplus (o \wedge 1) = x2 \oplus 0 = x2$, and the correct value $x2cor = x2$ is output at the output of the combinatorial element 332.

The errored value of the check bit c3' which is output by the memory cell 315 does not therefore result in an error in one of the data bits.

The same applies to errors in the values x1', c2' and x3'.

The storage device 103 shown in FIG. 3 is therefore configured so that, if only one of the memory cells 311 to 319 outputs an errored value, the combinatorial elements 331 to 334 output the corresponding correct values of the data bits which have been written to the memory cells 312, 314, 316 and 318. The corrected values x1cor, x2cor, x3cor, x4cor are then equal to the values x1, x2, x3, x4.

It similarly applies that the corrected values x1cor, x2cor, x3cor and x4cor are equal to the values x1, x2, x3, x4 if no error whatsoever has occurred.

The bits x1 . . . x4 of the bit sequence and the check bits c1 . . . c5 are stored in FIG. 3 in a total of 2·4+1=9 memory cells 311, 312, to 319. In FIG. 3, n=4 combinatorial elements 331, 332, 333, 334 are further present, in each case with three binary inputs and one binary output, in each case implementing a combinatorial function f.

The values output by a correction circuit such as the correction circuit 700 are referred to as corrected data values, irrespective of whether an error has or has not occurred in the circuit arrangement shown in FIG. 3.

The application of the memory cells 311-319 can correspond to an actual application in a chip layout, so that check value memory cells and data value memory cells are arranged alternately.

Each of the at least one of the multiplicity of check value memory cells is then spatially arranged between the two data value memory cells assigned to it from the multiplicity of data value memory cells.

The check value memory cell 313, for example, is assigned to the data value memory cells 312 and 314 and is spatially arranged between them. The check value memory cell 315 is assigned to the data value memory cells 314 and 316 and is spatially arranged between them.

In an application of this type, an implementation of the storage device 103 shown in FIG. 3 requires no intersection of lines which connect the different circuit components consisting of memory cells 311 to 319, XOR elements 321 to 325 and combinatorial elements 331 to 334, which can be advantageous for the implementation with a layout which is as simple as possible.

Further example embodiments of storage devices which are variations of the storage device 103 shown in FIG. 3 are described below with reference to FIGS. 4 and 5. To avoid repetitions, the differences between the storage devices shown in FIGS. 4 and 5 and the storage device 103 shown in FIG. 3 are primarily described. Otherwise, reference is made to the explanations relating to FIG. 3.

In some example embodiments, two check value memory cells are assigned in each case to the same two data value memory cells. One example of such a storage device 104 is shown in FIG. 4. Two check value memory cells 413 and 414, for example, are assigned here in each case to the data value memory cells 415 and 412.

A procedure of this type can make the storage device, for example the storage device 104, more resilient to bit errors, in particular adjacent 2-bit errors, as explained below.

Figure 4:
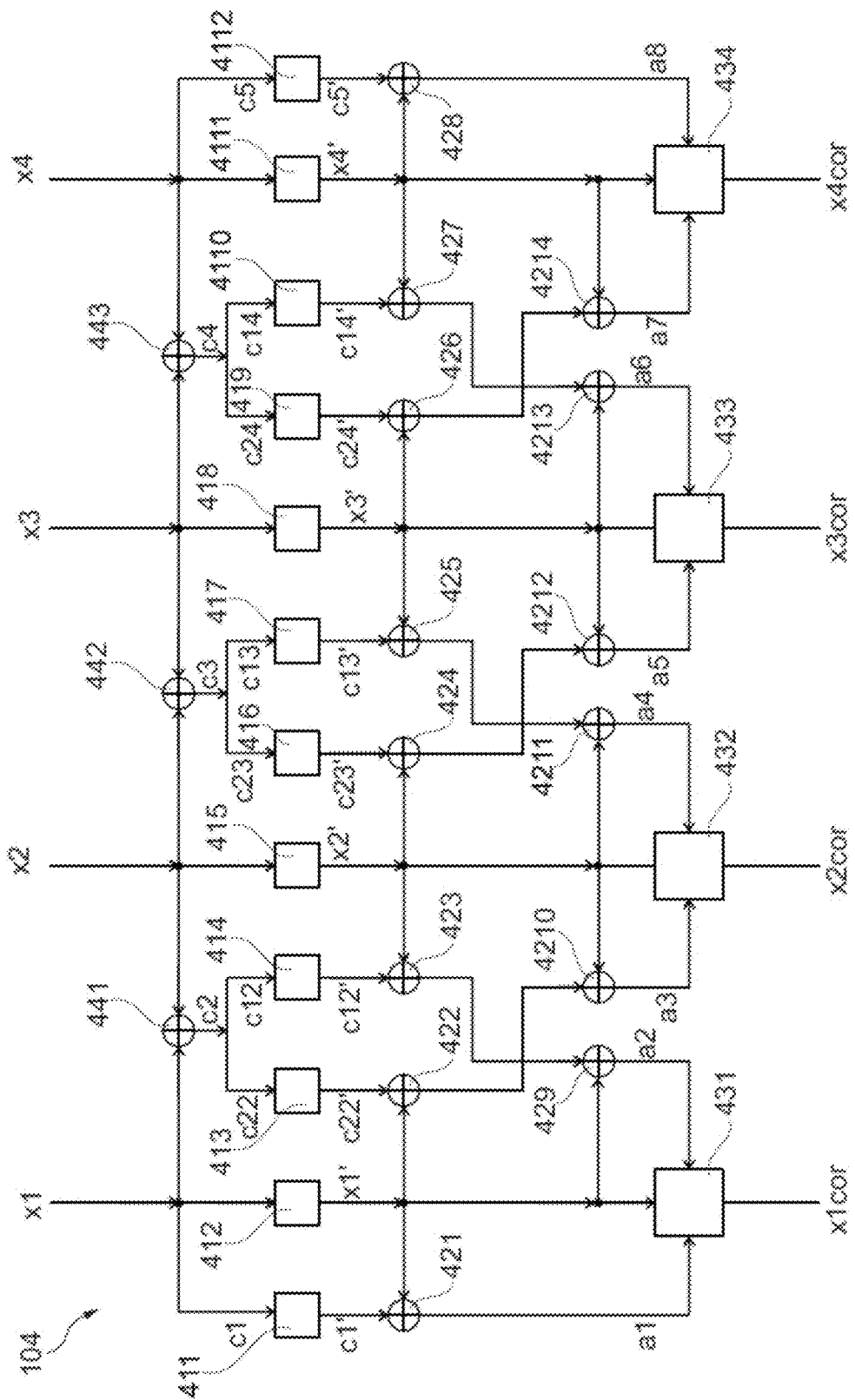

Here, the respective two check value memory cells which are assigned to the same two data value memory cells as shown in FIG. 4 can be spatially arranged between these two data value memory cells. The respective spatially more distantly arranged of the two check value memory cells can further be assigned to each data value memory cell of these two data value memory cells.

This can offer the advantage that the error correction to counter local interference events can be further improved. The capability to perform corrections, for example, in the case of adjacent 2-bit can be improved. This will similarly be explained below.

The storage device 104 can be used to store the bits x1, x2, x3, x4 of a binary sequence x1-x2-x3-x4.

Two consecutive bits x1, x2 and x2, x3 and x3, x4 in each case form the check bits $C2 = x1 \oplus x2$, $c3 = x2 \oplus x3$ and $c4 = x3 \oplus x4$. The check bits c2, c3, c4 are formed using XOR elements 441, 442 and 443 and are output at their respective outputs. The check bit c1=x1 and the check bit c5=x4 are further present. The check bits c2, c3 and c4 are therefore defined in each case as parity bits of the respective consecutive bits x1, x2 and x2, x3 and x3, x4. This corresponds to the procedure described with reference to FIG. 3.

The check bit c2 is stored as check bits C12 and C22 in the memory cells 414 and 413. The check bit c3 is stored as check bits c13 and c23 in the memory cells 417 and 416. The check bit c4 is stored as check bits c14 and c24 in the memory cells 4110 and 419. The check bits which are formed by the XOR elements 441, 442 and 443 are therefore stored in two memory cells or generally in more than one memory cell. The check bit c1 is stored in the memory cell 411 and the check bit c5 is stored in the memory cell 4112. The latter corresponds in turn to the procedure shown in FIG. 3.

Four combinatorial elements 431, 432, 433 and 434 in each case having three binary inputs and one binary output which in each case implement the combinatorial function f which can correspond to the combinatorial function previously described with reference to FIG. 3 are further provided in the storage device 104 shown in FIG. 4. Signals are fed via XOR or XNOR elements 421-429 and 4210-4214 to the combinatorial elements 431-434.

The memory cells 411 to 4112 output the possibly errored values c1', x1', c22', c12', x2', c23', c13', x3', c24', c14', x4' and c5' at their outputs during read-out, said values being equal to the values c1, x1, c22, c12, x2, c23, c13, x3, c24, c14, x4 and c5 written to them if no error has occurred, and said values differing from the written values if an error has occurred.

The output of the memory cell 411 is connected to a first input of the XOR element 421 whose second input is connected to the output of the memory cell 412.

The output of the memory cell 412 is additionally connected to the second input of the XOR element 422, to the first input of the XOR element 429 and to the first input of the combinatorial element 431.

The output of the memory cell 413 is connected to the first input of the XOR element 422.

The output of the memory cell 414 is connected to the first input of the XOR element 423 whose second input is connected to the output of the memory cell 415.

The output of the memory cell 415 is additionally connected to the second input of the XOR element 424, to the first input of the XOR element 4211, to the second input of the XOR element 4210 and to the first input of the combinatorial element 432.

The output of the memory cell 416 is connected to the first input of the XOR element 424. The output of the memory cell 417 is connected to the first input of the XOR element 425 whose second input is connected to the output of the memory cell 418.

The output of the memory cell 418 is additionally connected to the second input of the XOR element 426, to the first input of the XOR element 4213, to the second input of the XOR element 4212 and to the first input of the combinatorial element 433.

The output of the memory cell 419 is connected to the first input of the XOR element 426.

The output of the memory cell 4110 is connected to the first input of the XOR element 427 whose second input is connected to the output of the memory cell 4111.

The output of the memory cell 4111 is additionally connected to the first input of the XOR element 4214, to the second input of the XOR element 428 and to the first input of the combinatorial element 434.

The output of the memory cell 4112 is connected to the first input of the XOR element 428.

The output of the XOR element 421 which indicates the correction value a1 is connected to the second input of the combinatorial element 431.

The output of the XOR element 422 is connected to the first input of the XOR element 4210. The output of the XOR element 423 is connected to the second input of the XOR element 429.

The output of the XOR element 424 is connected to the first input of the XOR element 4212. The output of the XOR element 425 is connected to the second input of the XOR element 4211.

The output of the XOR element 426 is connected to the first input of the XOR element 4214. The output of the XOR element 427 is connected to the second input of the XOR element 4213. The output of the XOR element 428 which carries the binary value a8 is connected to the third input of the combinatorial element 434.

The output of the XOR element 429 which indicates the correction value a2 is connected to the third input of the combinatorial element 431.

The output of the XOR element 4210 which indicates the correction value a3 is connected to the second input of the combinatorial element 432.

The output of the XOR element 4211 which indicates the correction value a4 is connected to the third input of the combinatorial element 432.

The output of the XOR element 4212 which indicates the correction value a5 is connected to the second input of the combinatorial element 433.

The output of the XOR element 4213 which indicates the correction value a6 is connected to the third input of the combinatorial element 433.

The output of the XOR element 4214 which indicates the correction value a7 is connected to the second input of the combinatorial element 434.

The correction values a1 to a8 essentially perform the same function as the correction values a1 to a5 in FIG. 3. The function of the XOR or XNOR elements 322-324 which in each case comprise three inputs is replaced in FIG. 4 in each case by two XOR or XNOR devices with two inputs, e.g. elements 422, 429 or elements 423, 4210. The result is corresponding, and elements with three inputs can also be used in FIG. 4 or two elements with two inputs can also be used in each case in FIG. 3. In FIG. 4, check values are stored separately for different data value memory cells, i.e. data value memory cells and check value memory cells are not "shared" as in FIG. 3.

The respectively more distant check value memory cell is further assigned to each data value memory cell, e.g. the check value memory cells 413 and 417 (and not the adjacent memory cells 414 and 416) are assigned to the data value memory cell 415. As a result, adjacent 2-bit errors do not relate to two memory cells 412 to 4111 which are used to form the same corrected data value x1cor.

An arrangement of this type can offer the advantage that, in the case of two bit errors, both check value memory cells are not affected. This can improve the resilience of the device to bit errors, in particular adjacent 2-bit errors, for example triggered by ionizing radiation.

The combinatorial elements 431, 432, 433 and 434 output at their outputs the binary values x1cor, x2cor, x3cor and x4cor which are defined by the relationships:

$$x1cor = f(x1', a1, a2) = x1' \oplus (a1 \wedge a2),$$

$$x2cor = f(x2', a3, a4) = x2' \oplus (a3 \wedge a4),$$

$$x3cor=f(x3',a5,a6)=x3'\oplus(a5\wedge a6), \text{ and}$$

$$x4cor=f(x4',a7,a8)=x4'\oplus(a7\wedge a8),$$

similar to the combinatorial elements 331 to 334 shown in FIG. 3.

If, for example, an adjacent 2-bit error then occurs in the memory cells 412 and 413, so that $x1'=x1\oplus1$ and $c22'=C22\oplus1$ are errored, $a1=a2=1$ applies according to FIG. 4, whereas $a3=0$ continues to apply, since both input values of the XOR element 422 are errored and its output value does not change. In this case, $a3=0$ applies unchanged.

Similarly, $a4=a5=a6=a7=a8=0$ applies. The errored value $x1'=x1\oplus1$ is corrected using the combinatorial element 431 in $$x1cor=f(x1',1,1)=x1'\oplus(1\wedge1)=x1\oplus1=(x1\oplus1)\oplus1=x1,$$

whereas the error in the check value memory cell 413 has no effect at the outputs.

If an adjacent 2-bit error occurs in the memory cells 413 and 414, $a2=a3=1$ applies, along with $$a1=a4=a5=a6=a7=a8=0'; \text{ and}$$

$$x1'=x1 \text{ and } x2'=x2.$$

In this case, the following applies:

$$x1cor=f(x1',a1,a2)=f(x1,0,1)=x1\oplus(0\wedge1)=x1\oplus0=x1;$$
and $$x2cor=f(x2',a3,a4)=f(x2,1,0)=x2\oplus(1\wedge0)=x2\alpha0=x2.$$

The adjacent 2-bit error thus has no effect in the case of the values of $x1cor$ and $x2cor$.

It is similarly evident that all 1-bit errors and all adjacent 2-bit errors in the memory cells 412, 413; 413, 414; 414, 415; 415, 416; 416, 417; 417, 418; 418, 419; 419, 4110; 4110, 4111 are duly corrected or have no effect on the output at the outputs of the storage device 104. The storage device 104 is thus error-tolerant in respect of these adjacent 2-bit errors.

The circuit arrangement shown in FIG. 4 has a small, locally restricted number of intersections of lines, which can result in a relatively simple layout in an implementation.

In the example embodiments shown in FIGS. 3 and 4, there are check value memory cells to which only one data value memory cell is assigned, i.e. whose content is based on the data value to be stored of a data value memory cell, such as the check value memory cells 311, 319 in FIG. 3 or 411, 4112 in FIG. 4.

In other example embodiments, two of the data value memory cells are assigned to each of the multiplicity of check value memory cells. One example of this is the storage device 105 in FIG. 5. For this purpose, the storage device shown in FIG. 3A is enclosed, as it were, "in a circular shape", as indicated by the lines 5A. The elements shown in FIG. 5 are actually arranged in an enclosed shape, e.g. a rectangle, for this purpose in implementations. Memory cells 511 to 318 can thus be arranged circumferentially in two rows. This can simplify the provision of electrical connections.

The storage device 105 can therefore be regarded as a modification of the storage device 103. The circuit pails shown in FIG. 5 which correspond to the circuit pails shown in FIG. 3 are denoted in the same way as in FIG. 3 and will not therefore be described again.

Figure 5:
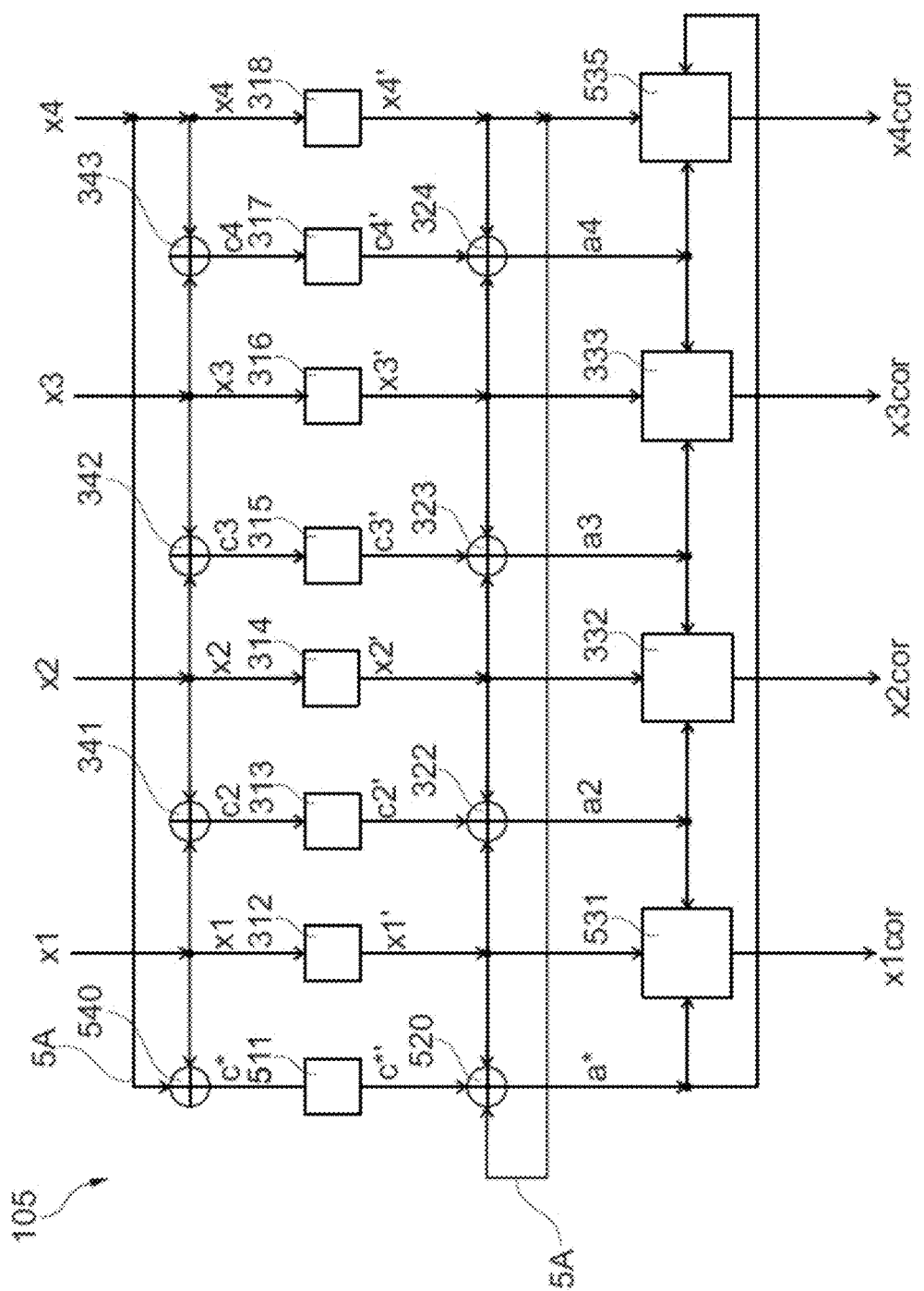

The first bit x1 and the nth bit, here the 4th bit x4, of the bit sequence are considered, as it were, as adjacent, so that the check value memory cell 311 for storing $c1=x1$ and the check value memory cell 319 for storing $c5=x4$ are replaced in the circuit arrangement shown in FIG. 3 are replaced by the check value memory cell 511 for storing the check bit $c^*=x1\oplus x4$ in the circuit arrangement shown in FIG. 5.

Only eight memory cells 511, 312, 313, 314, 315, 316, 317, 318 are present in FIG. 5, whereas the nine memory cells 311, 312, 313, 314, 315, 316, 317, 318, 319 are present in FIG. 3.

The number of memory cells is thereby reduced by one memory cell compared with the example shown in FIG. 3.

The XOR elements 325 and 321 are replaced accordingly by the XOR element 520 in FIG. 5.

The combinatorial elements 531 and 535 which differ from the combinatorial elements 331 and 334 only insofar as different input values are provided in part at their inputs are used in FIG. 5 instead of the combinatorial elements 331 and 334 in FIG. 3.

Compared with the example embodiment shown in FIG. 3, the XOR element 540 having two binary inputs and one output has been added in FIG. 5.

The first input of the XOR element 540 is connected to the fourth circuit input which carries the bit x4, whereas the second input of the XOR element 540 is connected to the first circuit input which carries the bit x1.

The XOR element 540 outputs at its output the check bit $c^*=x1\oplus x4$ which is present at the input of the memory cell 511.

The output of the memory cell 511 which outputs the possibly errored check bit $c^{*'}$ is connected to the first input of the XOR element 520 whose second input is connected to the output of the memory cell 318 and whose third input is connected to the output of the memory cell 312.

The output of the XOR element 520 which indicates the correction value $a^*$ is connected to the second input of the combinatorial element 531 and to the third input of the combinatorial element 535.

The first input of the combinatorial element 531 is connected to the output of the memory cell 312, whereas the output of the XOR element 332 is connected at its third input.

The first input of the combinatorial element 535 is connected to the output of the memory cell 318, whereas its second input is connected to the output of the XOR element 324.

The combinatorial element 531 forms the corrected bit $x1cor$, where $$x1cor=f(x1',a^*,a2)=x1'\oplus(a^*\wedge a2), \text{ where}$$
$$a^*=c^*\oplus x1'\oplus x4' \text{ and } a2=c2'\oplus X1'\oplus x2'.$$

The combinatorial element 535 forms the corrected bit $x4cor$, where $$x4cor=f(x4',a4,a^*)=x4'\oplus(a4\wedge a^*), \text{ where}$$
$$a4=c4'\oplus x3'\oplus x4'.$$

The example embodiments shown in FIGS. 4 and 5 can be combined. The bits x1 and xn of a bit sequence can thus be regarded as adjacent even if a check bit is stored in more than one memory cell, for example in two memory cells. The bits x1 and x4, for example, can be regarded as adjacent in a storage device 104, as shown in FIG. 4. A check bit $c^*=x1\oplus x4$ is then formed from the bits x1 and x4 and is stored in two memory cells which replace the memory cells 411 and 4112, and the modification of the circuit arrangement can otherwise be performed in a manner corresponding entirely to the described modification of the circuit arrangement shown in FIG. 3 into the circuit arrangement shown in FIG. 5.

Storage devices such as those described above can be configured:
- to define at least one first parity value based on the multiplicity of respective data values to be stored in the multiplicity of data value memory cells, and
- to define at least one second parity value based on a multiplicity of corrected data values.

Figure 6:
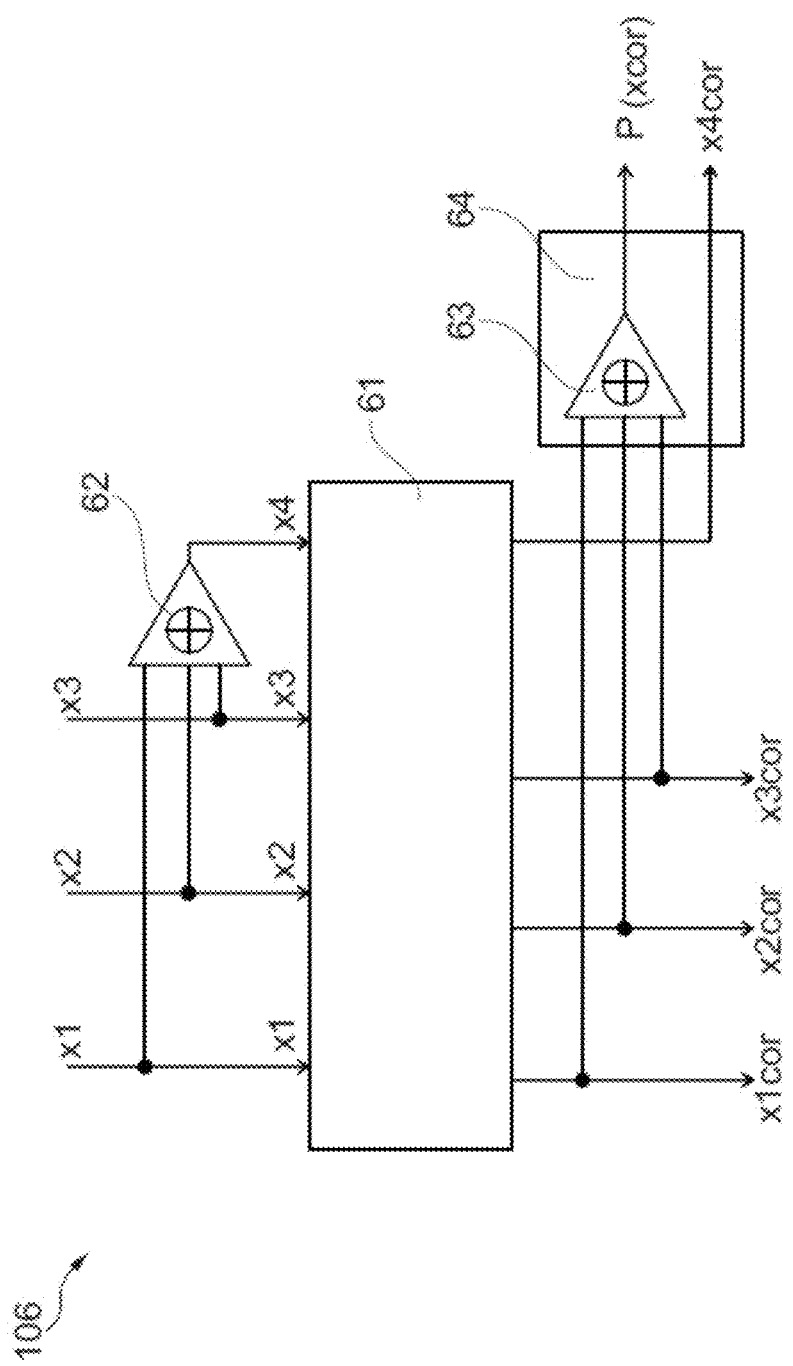

FIG. 6 shows a first example embodiment of such a storage device according to 106.

The storage device 106 has a first logic element, illustrated by way of example by a parity former 62, which is configured to define a first parity value x4 based on the multiplicity of data values x1 to x3 to be stored in a storage device 61. The storage device 106 further has a second logic element, illustrated by the parity former 63, which is configured to define a second parity value P(xcor). The storage device 61 can, for example, be one of the storage devices 103 to 105 or a combination thereof.

FIG. 6 illustrates an example embodiment of the storage of a bit sequence x1, x2, x3, x4 in a storage device 61, wherein an error detection using external circuit outputs is provided in addition to the error-tolerant storage of the bits x1, x2, x3, x4 in the storage device 61. The storage device 61 has four inputs for inputting the bits x1, x2, x3, x4 and four outputs for outputting the bits x1$cor$, x2$cor$, x3$cor$ and x4$cor$.

Three data bits x1, x2, x3 are provided, from which a fourth bit x4 is defined as a check bit. In the example shown in FIG. 6, the check bit x4 is defined as the parity bit x4=x1⊕x2⊕x3 of the data bits x1, x2, x3 by a parity former 62 having three inputs and one output. The data bits x1, x2, x3 are present at the three inputs of the parity former 62 which outputs the bit x4 at its output.

An error detection circuit 64 having four inputs and two outputs which is designed using the aforementioned parity former 63 having three inputs and one output is connected downstream of the storage device 61.

The first three corrected bits x1$cor$, x2$cor$ and x3$cor$ output by the storage device 61 are present at the inputs of the parity former 63, so that the parity former 63 forms a parity signal P(xcor), where $P(xcor)=x1cor \oplus x2cor \oplus x3cor$; and provides it at its output.

The value x4$cor$ which is output by the storage device 61 and is output unchanged by the storage device 61 is present at the fourth input of the error detection circuit 64.

The bits x4$cor$ and P(xcor) are output by the error detection circuit 64.

If x4$cor$=P(xcor) applies, no error is detected. If x4$cor$≠P(xcor) applies, an error is detected.

A comparator of the bits x4$cor$ and P(xcor) which can be implemented, for example, by an XOR element designed, for example, as a gate, is not shown in FIG. 6, but can be present in some example embodiments.

In the example embodiment described, the error detection is performed using the external output values x1$cor$, x2$cor$, x3$cor$, x4$cor$ of the storage device 61 which, for the following explanation, corresponds to the storage device 103 shown in FIG. 3.

If a single error occurs in one of the memory cells 312, 314, 316 or 318 within the storage device 61, the one error is corrected, so that x1$cor$=x1, x2$cor$=x2, x3$cor$=x3, x4$cor$=x4 apply.

If a single error occurs within the memory cells 311, 313, 315, 317 or 319, it has no effect on the output values of the storage device 61, so that x1$cor$=x1, x2$cor$=x2, x3$cor$=x3, x4$cor$=x4 then similarly apply.

A single error in one of the memory cells 311 to 319 does not therefore also result in a difference between x4$cor$ and P(xcor) and no error is indicated by the error detection circuit 64.

An adjacent 2-bit error in two of the memory cells 311 to 319 does not result in a 1-bit error in the output bits x1$cor$, x2$cor$, x3$cor$, x4$cor$, so that it can be detected by the error detection circuit 64 which verifies the parity of the output values.

Thus, for example, x2'=NOT(x2), c3'=NOT(c3), a2=1, a3=0 apply to a 2-bit error in the memory cells 314 and 315, and the combinatorial element 332 shown in FIG. 3 outputs the errored value x2$cor$=x2'=NOT(x2).

The adjacent 2-bit error in the memory cells 314 and 315 therefore results in only a 1-bit error in the output values of the storage device 61 which is detected by the error detection circuit 64 connected downstream of the storage device 61 as a 1-bit error on the basis of the errored parity.

For all further possible adjacent 2-bit errors in two of the memory cells 311 to 319, it is similarly possible to check that they similarly have the effect of 1-bit errors and can be detected by the error detection circuit 64.

In some example embodiments, all 1-bit errors of the memory cells are corrected by the storage device 61. In some example embodiments, all adjacent 2-bit errors of the memory cells have the effect of 1-bit errors at the circuit outputs and can be detected by the error detection circuit 64 for the circuit outputs.

A simple parity check on the external circuit outputs can be used here for error detection. As a result, the reliability of the storage device can be increased and/or the necessary outlay for a storage device with a desired error correction behavior can be reduced.

Figure 7:
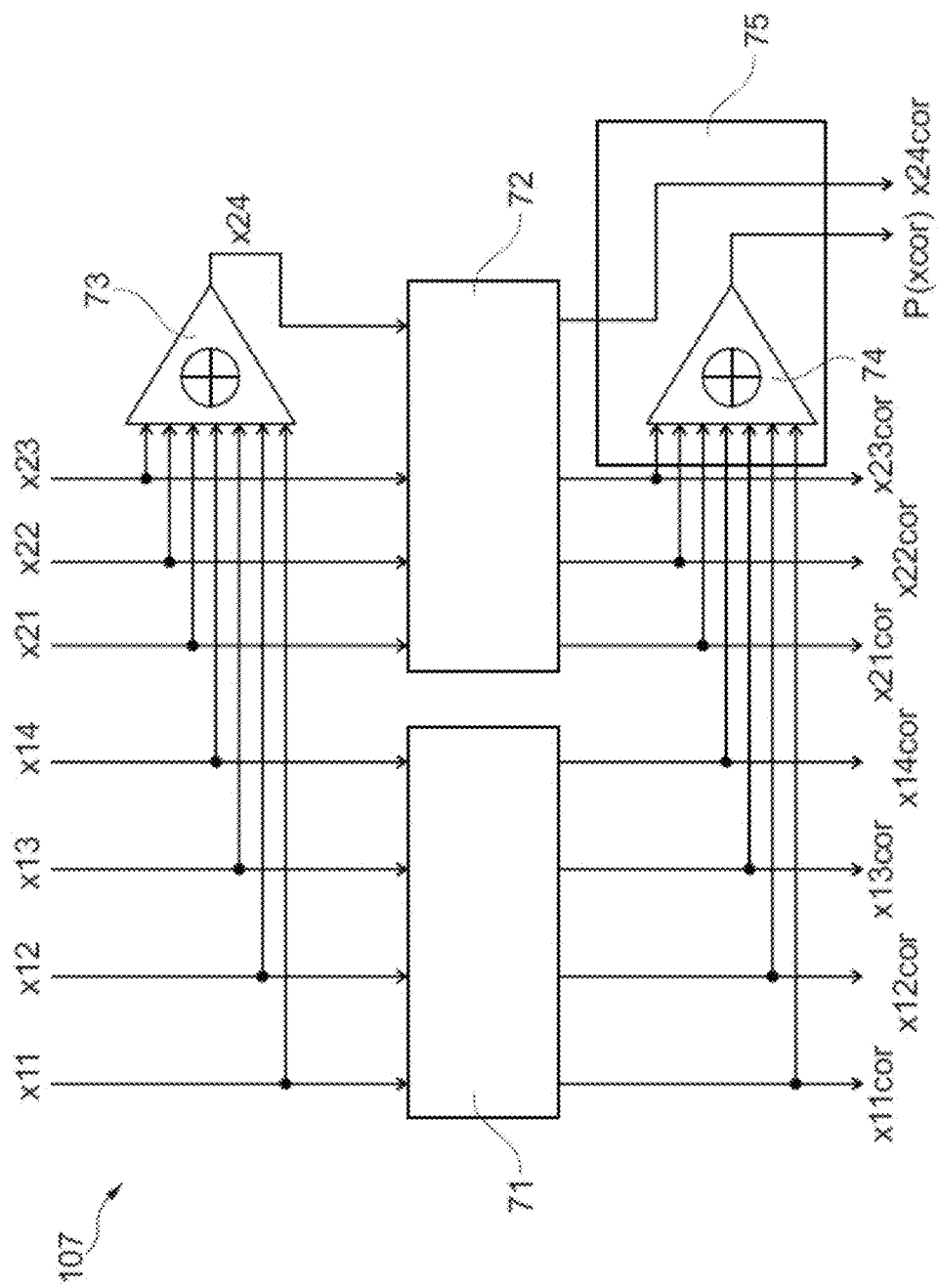

FIG. 7 shows a combination of a plurality of devices according to FIG. 6. An arrangement of this type can offer the advantage that the methods and devices described above and below for a relatively small number of data values, for example a small number of bits, can be combined with one another in such a way that a large number of data values, for example a large number of bits, can be stored. However, according to the example embodiment shown in FIG. 7, the complexity of the output data values of the error correction circuit does not increase with the number of stored data values. This can simplify the monitoring of the storage device for large data values also. This will be disclosed in detail below with reference to the specific example embodiment shown in FIG. 7 and the storage device 107.

FIG. 7 illustrates a further example embodiment of a storage device 107 which is configured to store a bit sequence X11, x12, x13, x14, X21, X22, X23, x24 in a circuit arrangement which is implemented as two storage devices 71 and 72. Each of the storage devices 71, 72 can be designed as discussed with reference to FIGS. 3-5. An error detection is provided here in addition to the error-tolerant storage of the bits X11, x12, x13, x14, x21, x22, x23, x24. The error detection can be implemented according to the error detection that will be discussed in connection with FIG. 8, or can use aspects of this implementation. However, it can also differ from the error detection shown in FIG. 8.

Seven data bits x11, x12, x13, x14, x21, x22, x23 are provided, from which an eighth bit x24 is defined as a check bit.

The check bit x24 is defined as the parity bit $x24=x11 \oplus x12 \oplus x13 \oplus x14 \oplus x21 \oplus x22 \oplus x23$ of the data bits x11, x12, x13, x14, x21, x22, x23, the data bits x11, x12, x13, x14, x21, x22, x23 are present at seven inputs of the parity former 73 which outputs the bit x24 at its output.

The storage device 71 has four inputs for inputting the bits x11, x12, x13, x14 and four outputs for outputting the bits x11cor, x12cor, x13cor, x14cor.

The storage device 72 has four inputs for inputting the bits x21, x22, x23, x24 and four outputs for outputting the bits x21cor, X22cor, x23cor, x24cor.

An error detection circuit 75 which is designed using a parity former 74 having seven inputs and one output is connected downstream of the storage devices 71 and 72.

The bits x11cor, x12cor, x13cor, x14cor, x21cor, x22cor, x23cor output by the storage devices 71 and 72 are present at the inputs of the parity former 74, so that the parity former 74 forms a parity signal P(xcor), where:

$$P(xcor)=x11cor \oplus x12cor \oplus x13cor \oplus x14cor \oplus x21cor \oplus x22cor \oplus x23cor$$

and provides it at its output. The value x24cor which is output by the storage device 72 and is output unchanged by the error detection circuit 75 is present at an eighth input of the error detection circuit 75.

If x24cor=P(xcor) applies, no error is detected. If x24cor≠P(xcor) applies, an error is detected.

Only one common parity bit, here the bit x24, which is input as the fourth bit into the storage device 72 and is stored and possibly corrected before being output is formed for error detection for the storage devices 71, 72.

Only one parity bit is used here for error detection in both storage devices 71 and 72. A common error detection circuit can also be implemented in a totally corresponding manner for more than two blocks, wherein the number of bits entered into the respective blocks may differ and may differ from four.

This can enable the outlay, for example in a monitoring circuit, to be minimized.

Storage devices can alternatively or additionally further comprises an error detection circuit. The error detection circuit can be configured to identify, on the basis of the correction values, whether an error in the corrected data value and/or an error in the content of at least one of the at least one of the multiplicity of data value memory cells and/or in the content of the at least one of the multiplicity of check value memory cells is/are present.

FIG. 8 shows an example embodiment of a storage device 108 in which an error detection circuit 81 is added to the storage device 103 shown in FIG. 3. The circuit parts which correspond in FIG. 8 to the circuit parts from FIG. 3 are denoted in FIG. 8 with the same reference numbers as in FIG. 3 and will not therefore be described again. The storage device shown in FIG. 4 or 5 can also be used instead of the storage device shown in FIG. 3.

In FIG. 8, the error detection circuit 81 has five binary inputs at which the correction values a1, a2, a3, a4, a5 are present, and it is designed so that it outputs the value of a Boolean function F(a1, a2, a3, a4, a5) as the error signal "Error" at its one binary output. Here, a1, a2, a3, a4, a5 are internal signal values of the circuit arrangement shown in FIG. 3, as previously described in connection with e.g., a2.

The Boolean function F(a1, a2, a3, a4, a5) can be defined as F(a1, a2, a3, a4, a5)=a1 $\vee$ a2 $\vee$ a3 $\vee$ a4 $\vee$ a5, so that, if one of the values a1, a2, a3, a4, a5 is equal to 1, the error signal F (a1, a2, a3, a4, a5)=Error=1 is defined and output by the error detection circuit 81.

If one of the values output by one of the memory cells 311 to 319 is errored, at least one of the binary values a1, a2, a3, a4, a5 is also equal to 1 and an error which has occurred is indicated in this example embodiment by the error detection circuit 81 as an error signal Error=1, irrespective of whether it is or is not corrected.

One option is to use an error detection circuit which defines an error signal depending on internal circuit signals or depending on signals output from the circuit arrangement.

One option is similarly to use an error detection circuit which defines an error signal depending on both internal signals and signals output from the circuit.

The error detection circuit 81 can be configured to output an error signal. The error detection circuit can be configured to correct an error. In such cases, it can also be referred to as an error correction circuit.

In the example shown in FIG. 8, the error detection circuit 81 is configured to output an error signal "Error". The error signal can be triggered depending on whether one or more errors are present. The error signal can comprise either a simple message, in the sense of "an error is present" or "an error is not present", or more complex information, for example it can provide precise details identifying the location where an error has occurred.

One option is to use an error code, wherein the error code is, for example, a linear code, for example a Hamming code, a Hsiao code or a shortened Hamming code, or a different code.

One option is similarly to provide an error detection circuit and/or an error correction circuit using external circuit signals and/or internal circuit signals, for example to define an error code.

Example 1

A storage device, comprising:
a multiplicity of data value memory cells,
a multiplicity of check value memory cells,
wherein two of the check value memory cells are assigned to at least one of the multiplicity of data value memory cells, and
wherein two of the data value memory cells are assigned to at least one of the multiplicity of check value memory cells, and
a correction circuit which is configured to output a corrected data value when reading out a selected data value memory cell of the at least one of the multiplicity of data value memory cells, based on a content of the selected data value memory cell and based on contents of the two check value memory cells assigned to the selected data value memory cell.

Example 2

The storage device according to example 1, wherein the at least one of the multiplicity of check value memory cells is configured to store a check value based on data values to be stored in the two data value memory cells assigned to it.

Example 3

The storage device according to example 2, wherein the storage device is configured to form the check value of the at least one of the multiplicity of check value memory cells based on an XOR operation or XNOR operation performed on the data values to be stored in the two data value memory cells assigned to the at least one of the multiplicity of check value memory cells.

Example 4

The storage device according to one of examples 1-3, wherein:
the two check value memory cells which are assigned to the at least one of the multiplicity of data value memory cells comprise a first check value memory cell and a second check value memory cell,
a first further of the multiplicity of data memory cells is further assigned to the first check value memory cell,
a second further of the multiplicity of data memory cells is further assigned to the second check value memory cell, and
the corrected data value is formed on the basis of the content of the selected data value memory cell, a content of the first check value memory cell, a content of the second check value memory cell, a content of the first further of the multiplicity of data value memory cells and a content of the second further of the multiplicity of data value memory cells.

Example 5

The storage device according to example 4, wherein the correction circuit is further configured:
to form a first correction value based on a first XOR operation or first XNOR operation performed on the content of the selected data value memory cell, the content of the first check value memory cell and the content of the first further of the multiplicity of data value memory cells, and
to form a second correction value based on a second XOR operation or second XNOR operation performed on the content of the selected data value memory cell, the content of the second check value memory cell and the content of the second further of the multiplicity of data value memory cells.

Example 6

The storage device according to example 5, wherein the correction circuit is further configured:
to form a logical value based on a first logical operation performed on the first correction value and on the second correction value, and
to form the corrected data value based on a second logical operation performed on the content of the selected data value memory cell and on the logical value.

Example 7

The storage device according to example 6, wherein:
the first logical operation comprises an AND operation and/or a NAND operation, and
the second logical operation comprises an XOR operation and/or an XNOR operation.

Example 8

The storage device according to one of examples 5-7, wherein the device further comprises an error detection circuit, wherein the error detection circuit is optionally configured to identify, on the basis of the corrected data value, the first correction value and the second correction value, whether an error in the corrected data value and/or an error in the content of at least one of the at least one of the multiplicity of data value memory cells and/or in the content of the at least one of the multiplicity of check value memory cells is/are present.

Example 9

The storage device according to one of examples 1-8, wherein each of the at least one of the multiplicity of check value memory cells is spatially arranged between the two data value memory cells assigned to it from the multiplicity of data value cells.

Example 10

The storage device according to one of examples 1-9, wherein:
two check value memory cells of the at least one check value memory cell are assigned in each case to the same two data value memory cells.

Example 11

The storage device according to example 10, wherein:
the respective two check value memory cells of the at least one check value memory cell which are assigned to the same two data value memory cells are spatially arranged between these two data value memory cells, and
the respective spatially more distantly arranged of the respective two check value memory cells is assigned to each data value memory cell of the same two data value memory cells.

Example 12

The storage device according to one of examples 1-11, wherein two of
the data value memory cells are assigned to each of the multiplicity of check value memory cells.

Example 13

The storage device according to one of examples 1-12, wherein at least one further check value memory cell of the multiplicity of check value memory cells is assigned to one of the data value memory cells and is configured to store as a check value a data value which is to be stored in the data value memory cell assigned to it.

Example 14

The storage device according to one of examples 1-13, further comprising a write circuit which is configured to store respective data values as the respective contents in the multiplicity of data value memory cells, and
to store a check value as an XOR operation or XNOR operation performed on the data values to be stored in the data value memory cells assigned to the respective check value memory cell as content in each of the check value memory cells of the at least one of the multiplicity of check value memory cells.

Example 15

The storage device according to one of examples 1-14, wherein the device is configured:

to define at least one first parity value based on the multiplicity of respective data values to be stored in the multiplicity of data value memory cells, and to define at least one second parity value based on a multiplicity of corrected data values.

Example 16

A method for reading memory cells in a storage device having
a multiplicity of data value memory cells,
a multiplicity of check value memory cells,
wherein two of the check value memory cells are assigned to at least one of the multiplicity of data value memory cells, wherein the method comprises:
receiving a content of a selected data value memory cell of a multiplicity of data value memory cells,
receiving contents from two check value memory cells of a multiplicity of check value memory cells, wherein the two check value memory cells are assigned to the selected data value memory cell,
defining a corrected data value based on:
the content of the selected data value memory cell, and
the contents of the two check value memory cells assigned to the selected data value memory cell.

Example 17

The method according to example 16, wherein
the two check value memory cells which are assigned to the at least one of the multiplicity of data value memory cells comprise a first check value memory cell and a second check value memory cell,
a first further of the multiplicity of data memory cells is further assigned to the first check value memory cell,
a second further of the multiplicity of data memory cells is further assigned to the second check value memory cell, and
the method furthermore comprises:
defining the corrected data value based on the content of the selected data value memory cell, a content of the first check value memory cell, a content of the second check value memory cell, a content of the first further of the multiplicity of data value memory cells and a content of the second further of the multiplicity of data value memory cells.

Example 18

A method for writing memory cells, comprising:
writing a check value as a content of a check value memory cell, wherein the check value memory cell is assigned to two data value memory cells and wherein the check value is based on data values to be stored of the assigned data value memory cells, and
writing the data values to be stored to the assigned data value memory cells.

Example 19

The method for writing memory cells according to example 18, wherein the method further comprises:
forming the check value of the at least one of the multiplicity of check value memory cells based on an XOR operation or XNOR operation performed on the data values to be stored in the two data value memory cells assigned to the at least one of the multiplicity of check value memory cells.

Example 20

A method for reading and writing memory cells, comprising:
writing at least one data value to at least one selected data value memory cell according to one of examples 18-19, and
defining at least one corrected data value according to one of examples 16-17.

Example 21

A storage device, comprising:
a multiplicity of first memory cells, wherein each first memory cell is configured to receive and store a data value,
a multiplicity of second memory cells, wherein
two second memory cells are assigned to each of the first memory cells, wherein
two of the first memory cells are assigned to each second memory cell of a first subset of the second memory cells, and
each of the second memory cells of the first subset is configured to store a check value based on the respective data values of the two first memory cells assigned to it, and
a read-out circuit which is configured to output a corrected data value when reading out a selected memory cell of the first memory cells, wherein the corrected data value is based on:
a read-out data value read out from the selected memory cell, and
read-out check values read out from the two second memory cells assigned to the selected first memory cell.

Example 22

The storage device according to example 21, wherein the corrected data value for each second memory cell assigned to the selected first memory cell and belonging to the first subset is further based on a read-out data value read out from a different first memory cell which is assigned to the respective second memory cell and which is not the selected first memory cell.

Example 23

The device according to example 21, wherein the read-out circuit comprises a multiplicity of Exclusive-OR gate circuits, wherein an Exclusive-OR gate circuit is assigned to each second memory cell of the first subset, which is configured to generate a check output value as an Exclusive-OR operation performed on the stored read-out check value read out from the respective second memory cell and on the read-out data values read out from the first memory cells assigned to the respective second memory cell,
wherein the corrected data value is based on the check output values of the Exclusive-OR gate circuits of the second memory cells which are assigned to the selected first memory cell.

Example 24

The device according to example 23, wherein:
the read-out circuit is configured to generate the corrected data value as an Exclusive-OR operation between the read-out data value of the selected first memory cell and an AND operation performed on the check output values.

Example 25

The device according to example 23 or 24, wherein the device further comprises an error detection circuit, wherein the error detection circuit is optionally configured to identify whether an error is present in the corrected data values on the basis of the corrected data values and check output values of the read-out circuit.

Example 26

The device according to one of examples 21 to 25, wherein each second memory cell of the first subset of the second memory cells is arranged between the first memory cells assigned to it.

Example 27

The device according to example 26, wherein two second memory cells of the first subset are assigned in each case to the same two first memory cells and are arranged between them, wherein the respective more distantly arranged of the respective two second memory cells is assigned to each first memory cell of the same two first memory cells.

Example 28

The device according to one of examples 21 to 27, wherein the first subset comprises all second memory cells.

Example 29

The device according to one of examples 21 to 27, wherein the multiplicity of second memory cells comprises a second subset of second memory cells, wherein each of the second memory cells of the second subset is assigned to one of the first memory cells and is configured to store as a check value the data value of the first memory cell assigned to it.

Example 30

The device according to one of examples 21 to 29, further comprising a write circuit which is configured to store data values to be stored as the data values in the first memory cells and to store the check value in each second memory cell of the first subset as an Exclusive-OR operation performed on the data values to be stored in the first memory cells assigned to the respective second memory cell.

Example 31

The device according to one of examples 21 to 30, wherein the device is configured:
to define at least one first parity value based on the multiplicity of respective data values of the first memory cells, and
to provide at least one second parity value based on the multiplicity of corrected data values.

Example 32

The device according to example 31, wherein the device is configured to identify a presence of an error based on a comparison of the first parity value with the second parity value.

In this description, in which specific example embodiments have been illustrated and described, persons with conventional technical knowledge will recognize that a multiplicity of alternative and/or equivalent implementations can be chosen as a substitution for the specific example embodiments which are shown and described in this description without departing the scope of the presented disclosure. This application is intended to cover all adaptations or variations of the specific example embodiments which are discussed here. The claimed subject-matters are therefore limited only by the claims and the equivalents of the claims.

What is claimed is:
1. A storage device, comprising:
a multiplicity of data value memory cells,
a multiplicity of check value memory cells,
wherein exactly two of the check value memory cells are assigned to at least one of the multiplicity of data value memory cells, and
wherein two of the data value memory cells are assigned to at least one of the multiplicity of check value memory cells, and
a correction circuit which is configured to output a corrected data value when reading out a selected data value memory cell of the at least one of the multiplicity of data value memory cells, based on a content of the selected data value memory cell and on contents of the exactly two check value memory cells assigned to the selected data value memory cell.
2. The storage device as claimed in claim 1, wherein the at least one of the multiplicity of check value memory cells is configured to store a check value based on data values to be stored in the two data value memory cells assigned to it.
3. The storage device as claimed in claim 2, wherein the storage device is configured to form the check value of the at least one of the multiplicity of check value memory cells based on an XOR operation or XNOR operation performed on the data values to be stored in the two data value memory cells assigned to the at least one of the multiplicity of check value memory cells.
4. The storage device as claimed in claim 1, wherein:
the exactly two check value memory cells which are assigned to the at least one of the multiplicity of data value memory cells comprise a first check value memory cell and a second check value memory cell,
a first further of the multiplicity of data value memory cells is further assigned to the first check value memory cell,
a second further of the multiplicity of data value memory cells is further assigned to the second check value memory cell, and
the corrected data value is formed on the basis of the content of the selected data value memory cell, a content of the first check value memory cell, a content of the second check value memory cell, a content of the first further of the multiplicity of data value memory cells and a content of the second further of the multiplicity of data value memory cells.

5. The storage device as claimed in claim 4, wherein the correction circuit is further configured:
- to form a first correction value based on a first XOR operation or first XNOR operation performed on the content of the selected data value memory cell, the content of the first check value memory cell and the content of the first further of the multiplicity of data value memory cells, and
- to form a second correction value based on a second XOR operation or second XNOR operation performed on the content of the selected data value memory cell, the content of the second check value memory cell and the content of the second further of the multiplicity of data value memory cells.

6. The storage device as claimed in claim 5, wherein the correction circuit is further configured:
- to form a logical value based on a first logical operation performed on the first correction value and on the second correction value, and
- to form the corrected data value based on a second logical operation performed on the content of the selected data value memory cell and on the logical value.

7. The storage device as claimed in claim 6, wherein:
- the first logical operation comprises an AND operation and/or a NAND operation, and
- the second logical operation comprises an XOR operation and/or an XNOR operation.

8. The storage device as claimed in claim 5, further comprising an error detection circuit.

9. The storage device as claimed in claim 1, wherein each of the at least one of the multiplicity of check value memory cells is spatially arranged between the two data value memory cells assigned to it from the multiplicity of data value memory cells.

10. The storage device as claimed in claim 1, wherein:
- two check value memory cells of the at least one of the multiplicity of check value memory cells are assigned in each case to the same two data value memory cells.

11. The storage device as claimed in claim 10, wherein:
- the respective two check value memory cells of the at least one of the multiplicity of check value memory cells which are assigned to the same two data value memory cells are spatially arranged between these two data value memory cells, and
- the respective spatially more distantly arranged of the respective two check value memory cells is assigned to each data value memory cell of the same two data value memory cells.

12. The storage device as claimed in claim 1, wherein two of the data value memory cells are assigned to each of the multiplicity of check value memory cells.

13. The storage device as claimed in claim 1,
wherein at least one further check value memory cell of the multiplicity of check value memory cells is assigned to one of the data value memory cells and is configured to store as a check value a data value which is to be stored in the data value memory cell assigned to it.

14. The storage device as claimed in claim 1, further comprising a write circuit which is configured to store respective data values as the respective contents in the multiplicity of data value memory cells, and
- to store a check value as an XOR operation or XNOR operation performed on the data values to be stored in the data value memory cells assigned to the respective check value memory cell as content in each of the check value memory cells of the at least one of the multiplicity of check value memory cells.

15. The storage device as claimed in claim 1, wherein the storage device is configured:
- to define at least one first parity value based on the multiplicity of respective data values to be stored in the multiplicity of data value memory cells, and
- to define at least one second parity value based on a multiplicity of corrected data values.

16. A method for reading memory cells in a storage device having
- a multiplicity of data value memory cells,
- a multiplicity of check value memory cells,
- wherein exactly two of the check value memory cells are assigned to at least one of the multiplicity of data value memory cells, wherein the method comprises:
  - receiving a content of a selected data value memory cell of the multiplicity of data value memory cells,
  - receiving contents from the exactly two check value memory cells of the multiplicity of check value memory cells, wherein the exactly two check value memory cells are assigned to the selected data value memory cell,
  - defining a corrected data value based on:
    - the content of the selected data value memory cell, and
    - the contents of the exactly two check value memory cells assigned to the selected data value memory cell.

17. The method as claimed in claim 16, wherein
- the exactly two check value memory cells which are assigned to the at least one of the multiplicity of data value memory cells comprise a first check value memory cell and a second check value memory cell,
- a first further of the multiplicity of data memory cells is further assigned to the first check value memory cell,
- a second further of the multiplicity of data memory cells is further assigned to the second check value memory cell, and
- the method further comprises:
  - defining the corrected data value based on the content of the selected data value memory cell, a content of the first check value memory cell, a content of the second check value memory cell, a content of the first further of the multiplicity of data value memory cells and a content of the second further of the multiplicity of data value memory cells.

18. A method comprising:
- storing a first data bit in a first data memory cell;
- storing a second data bit in a second data memory cell;
- storing a third data bit in a third data memory cell;
- storing a first check bit in a first check memory cell, the first check bit being an XOR or XNOR of the first data bit and the second data bit; and
- storing a second check bit in a second check memory cell, the second check bit being an XOR or XNOR of the second data bit and the third data bit.

19. The method of claim 18, further comprising:
- reading the first data bit from the first data memory cell to form a first read data bit;
- reading the second data bit from the second data memory cell to form a second read data bit;
- reading the third data bit from the third data memory cell to form a third read data bit;
- reading the first check bit from the first check memory cell to form a first read check bit;
- reading the second check bit from the second check memory cell to form a second read check bit;

determining an XOR or XNOR of the first read data bit, the first read check bit, and the second data bit to determine a first intermediate value;

determining an XOR or XNOR of the second read data bit, the second read check bit, and the third read data bit to determine a second intermediate value; and performing a combinatorial operation of on the second read data bit, the first intermediate value, and the second intermediate value to determine an error corrected second data bit.

20. The method of claim 19, therein the combinatorial operation comprises:

determining an AND or NAND of the first intermediate value and the second intermediate value to determine a third intermediate value; and determining an XOR or XNOR of the third intermediate value the second read data bit to form the error corrected second data bit.

21. A storage device, comprising:

a multiplicity of data value memory cells, a multiplicity of check value memory cells, wherein two of the check value memory cells are assigned to at least one of the multiplicity of data value memory cells, and wherein two of the data value memory cells are assigned to at least one of the multiplicity of check value memory cells, and a correction circuit which is configured to output a corrected data value when reading out a selected data value memory cell of the at least one of the multiplicity of data value memory cells, based on a content of the selected data value memory cell and based on contents of the two check value memory cells assigned to the selected data value memory cell, wherein each of the at least one of the multiplicity of check value memory cells is spatially arranged between the two data value memory cells assigned to it from the multiplicity of data value memory cells.

22. A storage device, comprising:

a multiplicity of data value memory cells, a multiplicity of check value memory cells, wherein two of the check value memory cells are assigned to at least one of the multiplicity of data value memory cells, and wherein two of the data value memory cells are assigned to at least one of the multiplicity of check value memory cells, wherein two check value memory cells of the at least one of the multiplicity of check value memory cells are assigned in each case to the same two data value memory cells, and a correction circuit which is configured to output a corrected data value when reading out a selected data value memory cell of the at least one of the multiplicity of data value memory cells, based on a content of the selected data value memory cell and based on contents of the two check value memory cells assigned to the selected data value memory cell, wherein two check value memory cells of the at least one of the multiplicity of check value memory cells are assigned in each case to the same two data value memory cells.

23. A storage device, comprising:

a multiplicity of data value memory cells, a multiplicity of check value memory cells, wherein two of the check value memory cells are assigned to at least one of the multiplicity of data value memory cells, and wherein two of the data value memory cells are assigned to at least one of the multiplicity of check value memory cells, and a correction circuit which is configured to output a corrected data value when reading out a selected data value memory cell of the at least one of the multiplicity of data value memory cells, based on a content of the selected data value memory cell and based on contents of the two check value memory cells assigned to the selected data value memory cell, wherein at least one further check value memory cell of the multiplicity of check value memory cells is assigned to one of the data value memory cells and is configured to store as a check value a data value which is to be stored in the data value memory cell assigned to it.

* * * * *